(12) United States Patent
Tanaka et al.

(10) Patent No.: US 8,956,807 B2
(45) Date of Patent: Feb. 17, 2015

(54) METHOD FOR FORMING RESIST PATTERN, AND COMPOSITION FOR FORMING RESIST UNDERLAYER FILM

(71) Applicant: JSR Corporation, Tokyo (JP)

(72) Inventors: Hiromitsu Tanaka, Tokyo (JP); Kazunori Takanashi, Tokyo (JP); Shinya Minegishi, Tokyo (JP); Takashi Mori, Tokyo (JP); Tomoaki Seko, Tokyo (JP); Jyunya Suzuki, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/630,245

(22) Filed: Sep. 28, 2012

(65) Prior Publication Data

US 2013/0101942 A1    Apr. 25, 2013

(30) Foreign Application Priority Data

Sep. 30, 2011  (JP) .................. 2011-218735
Sep. 25, 2012  (JP) .................. 2012-211593

(51) Int. Cl.
*G03F 7/11*  (2006.01)
*G03F 7/20*  (2006.01)
*G03F 7/30*  (2006.01)
*G03F 7/32*  (2006.01)

(52) U.S. Cl.
USPC ......... 430/311; 430/272.1; 430/325; 430/331

(58) Field of Classification Search
None
See application file for complete search history.

(56) References Cited

U.S. PATENT DOCUMENTS

| 8,669,042 | B2 * | 3/2014 | Anno et al. ............. 430/325 |
| 2011/0287369 | A1 * | 11/2011 | Shibayama et al. ....... 430/316 |
| 2012/0183908 | A1 * | 7/2012 | Anno et al. ............. 430/325 |
| 2013/0183830 | A1 * | 7/2013 | Takeda et al. ........... 438/703 |

FOREIGN PATENT DOCUMENTS

| JP | 06-012452 B2 | 5/1984 |
| JP | 59-093448 | 5/1984 |
| JP | 05-188598 | 7/1993 |
| JP | 2000-199953 | 7/2000 |
| JP | 2001-284209 | 10/2001 |
| JP | 2005-352384 | 12/2005 |
| JP | 2007-226170 | * 9/2007 |
| JP | 2008-039811 | 2/2008 |
| JP | 2010-085912 | 4/2010 |
| WO | WO2010/071155 A1 * | 6/2010 |
| WO | WO2012/033004 A1 * | 3/2012 |
| WO | WO2012/039337 A1 * | 3/2012 |

OTHER PUBLICATIONS

JPO English abstract for JP2007-226170 (2007).*
Machine-assisted English translation of JP 2007-226170 as provided by JPO (2007).*

* cited by examiner

*Primary Examiner* — Sin Lee
(74) *Attorney, Agent, or Firm* — Oblon, Spivak, McClelland, Maier & Neustadt, L.L.P.

(57) ABSTRACT

A resist pattern-forming method capable of forming a resist pattern excellent in pattern collapse resistance in the case of development with the organic solvent in multilayer resist processes. The method has the steps of: (1) providing a resist underlayer film on a substrate using a composition for forming a resist underlayer film; (2) providing a resist film on the resist underlayer film using a photoresist composition; (3) exposing the resist film; and (4) developing the exposed resist film using a developer solution containing no less than 80% by mass of an organic solvent, in which the composition for forming a resist underlayer film contains (A) a component that includes a polysiloxane chain and that has a carboxyl group, a group that can generate a carboxyl group by an action of an acid, an acid anhydride group or a combination thereof.

8 Claims, No Drawings

METHOD FOR FORMING RESIST PATTERN, AND COMPOSITION FOR FORMING RESIST UNDERLAYER FILM

BACKGROUND OF THE INVENTION

1. Field of the Invention

The present invention relates to a resist pattern-forming method, and a composition for forming a resist underlayer film.

2. Discussion of the Background

In attempts to improve integrity along with miniaturization of semiconductor devices, etc., miniaturization of a processing size by multilayer resist processes using a resist underlayer film has progressed. Among such multilayer resist processes, a multilayer resist process in which a resist underlayer film is a silicon-containing film will be explained below. First, a resist underlayer film is provided on a substrate to be processed using a composition for forming a resist underlayer film containing a polysiloxane, and thereafter a resist film that is an organic film having a different etching selectivity from that of the resist underlayer film is provided using a photoresist composition. Next, the resist film is exposed through a mask pattern and developed by a developer solution such as an aqueous alkali solution to obtain a resist pattern. Subsequently, the resist pattern is transferred to the resist underlayer film by dry-etching. Finally, the pattern is transferred to the substrate to be processed by dry-etching to obtain a substrate provided with a desired pattern (see Japanese Unexamined Patent Application, Publication Nos. 2001-284209, 2010-85912 and 2008-39811).

Today, also in the case in which such a multilayer resist process is used, further miniaturization of a pattern has been demanded. However, when a composition containing a conventional polysiloxane is used as a resist underlayer film, along with miniaturization of a pattern, a pattern collapse of a resist pattern formed on the resist underlayer film becomes likely to occur. Therefore, a composition for forming a resist underlayer film has been demanded to improve a pattern collapse resistance of a resist pattern.

On the other hand, as a developer solution that develops a resist film, a technique in which an organic solvent having a lower polarity than an aqueous alkali solution is used has been known (see Japanese Unexamined Patent Application, Publication No. 2000-199953). In the case in which development is carried out using such an organic solvent, an optical contrast can be improved, and as a result, a finer pattern can be formed. Therefore, a resist pattern-forming method and a composition for forming a resist underlayer film capable of forming a resist pattern excellent in pattern collapse resistance have been demanded not only in the case of a development with an alkali but also particularly, in the case of a development with an organic solvent.

PRIOR ART DOCUMENTS

Patent Documents

Patent Document 1: Japanese Unexamined Patent Application, Publication No. 2001-284209
Patent Document 2: Japanese Unexamined Patent Application, Publication No. 2010-85912
Patent Document 3: Japanese Unexamined Patent Application, Publication No. 2008-39811
Patent Document 4: Japanese Unexamined Patent Application, Publication No. 2000-199953

SUMMARY OF THE INVENTION

The present invention was made in view of the foregoing circumstances, and an object of the invention is to provide a resist pattern-forming method and a composition for forming a resist underlayer film which are capable of forming a resist pattern excellent in pattern collapse resistance, when a development is carried out using an organic solvent in a multilayer resist process.

One aspect of the present invention made for solving the foregoing problems provides a resist pattern-forming method, including the steps of:

(1) providing a resist underlayer film on a substrate using a composition for forming a resist underlayer film;

(2) providing a resist film on the resist underlayer film using a photoresist composition;

(3) exposing the resist film; and (4) developing the exposed resist film using a developer solution containing no less than 80% by mass of an organic solvent, in which the composition for forming a resist underlayer film contains (A) a component that includes a polysiloxane chain and that has a carboxyl group, a group that can generate a carboxyl group by an action of an acid, an acid anhydride group or a combination thereof (hereinafter, may be also referred to as "component (A)").

Since the resist pattern-forming method includes the steps described above and the composition containing the component (A) is used in providing a resist underlayer film, a resist pattern excellent in pattern collapse resistance can be formed in a multilayer resist process in which development is carried out using an organic solvent. Although it is not necessarily clear why the resist pattern-forming method that has the configuration described above achieves the effect, it is conjectured that, for example, due to the presence of a carboxyl group, a group that can generate a carboxyl group by an action of an acid and/or an acid anhydride group in a resist underlayer film provided, an appropriate interaction with a carboxyl group or the like that is generated in the resist pattern on the resist underlayer film in development with the organic solvent occurs, and as a result, pattern collapse resistance of the resist pattern becomes excellent, and the like.

It is preferred that the component (A) contains (a) a polysiloxane that has a carboxyl group, a group that can generate a carboxyl group by an action of an acid, an acid anhydride group or a combination thereof (hereinafter, may be also referred to as "polysiloxane (a)").

According to the resist pattern-forming method, the component (A) includes the specific polysiloxane, whereby it is believed that an appropriate interaction with a carboxyl group that is generated in the resist pattern on the resist underlayer film in development with the organic solvent, and as a result, a pattern collapse resistance of the resist pattern becomes excellent.

It is also preferred that the component (A) includes (b) a vinyl polymer that has a carboxyl group, a group that can generate a carboxyl group by an action of an acid, an acid anhydride group or a combination thereof (hereinafter, may be also referred to as "vinyl polymer (b)"), and (c) a polysiloxane.

According to the resist pattern-forming method, since the component (A) includes the specific polymer and polysiloxane, the specific polymer unevenly distributes on the surface of the resist underlayer film, whereby the abundance ratio of a carboxyl group, etc. on the surface can be enhanced. As a result, the pattern collapse resistance of the resist pattern becomes excellent.

It is preferred that the vinyl polymer (b) further has a silicon-containing group. Since the vinyl polymer (b) further has the silicon-containing group, an affinity to the polysiloxane (c) is enhanced, and as a result, the pattern collapse resistance of the resist pattern can be improved.

It is preferred that the composition for forming a resist underlayer film further contains (B) a nitrogen-containing compound. Since the composition for forming a resist underlayer film used further contains the nitrogen-containing compound (B) in the resist pattern-forming method, an oxygen ashing resistance of the resist underlayer film provided is improved.

The composition for forming a resist underlayer film of the present invention contains (a') a polysiloxane having an acid anhydride group (hereinafter, may be also referred to as "polysiloxane (a')").

Since the composition for forming a resist underlayer film contains the polysiloxane (a') that has the specific structure, a resist pattern excellent in pattern collapse resistance can be formed in the case of development with the organic solvent in a multilayer resist process. It is believed that, for example, the interaction described above between the resist underlayer film and the carboxyl group, etc. that is generated in the resist pattern is strengthened due to the polysiloxane (A') having an acid anhydride group, and the like. Therefore, the composition for forming a resist underlayer film can be particularly suitably used for the resist pattern-forming method. In addition, the composition for forming a resist underlayer film achieves, for example, an effect for further improving the pattern collapse resistance in comparison with a composition for forming a resist underlayer film containing polysiloxane having a hydrophilic group of a carboxyl group, etc. not only in the case of development with the organic solvent, but also particularly in the case of development with the alkali.

It is preferred that the acid anhydride group is a succinic acid anhydride group. Since the acid anhydride group is the specific acid anhydride group, the pattern collapse resistance of the resist pattern formed from the composition for forming a resist underlayer film can be improved.

It is preferred that the composition for forming a resist underlayer film further contains the nitrogen-containing compound (B). Since the composition for forming a resist underlayer film further contains the nitrogen-containing compound (B) according to the composition for forming a resist underlayer film, the oxygen ashing resistance of the resist underlayer film provided is improved.

It is preferred that the polysiloxane having an acid anhydride group (a') is a hydrolytic condensation product of a compound that includes a silane compound represented by the following formula (1a) (hereinafter, may be also referred to as "silane compound (1a)").

(1a)

In the formula (1a), $R^{1a}$ represents a monovalent organic group that includes an acid anhydride group; $R^2$ represents a hydrogen atom, a fluorine atom, a cyano group, an alkyl group having 1 to 5 carbon atoms, a cyanoalkyl group, an alkenyl group or an aryl group; X represents a halogen atom or —$OR^3$, wherein $R^3$ represents a monovalent organic group; a is an integer of 1 to 3; and b is an integer of 0 to 2, wherein an inequality of $1 \leq (a+b) \leq 3$ is satisfied.

Since the polysiloxane (a') is a hydrolytic condensation product of a compound that includes the silane compound (1a) having the specific structure, the polysiloxane (a') can be conveniently synthesized by a hydrolytic condensation reaction using the silane compound (1a).

It is preferred that $R^{1a}$ in the above formula (1a) is a monovalent organic group that includes a succinic acid anhydride group. Since the polysiloxane (a') is formed from the silane compound having the specific structure, the composition for forming a resist underlayer film can further improve the pattern collapse resistance of the resist pattern formed.

Here, the term "organic group" herein is referred to a group that includes at least one carbon atom.

As described above, the resist pattern-forming method and the composition for forming a resist underlayer film can form a resist pattern excellent in pattern collapse resistance in the case of development with the organic solvent in a multilayer resist process.

DESCRIPTION OF THE EMBODIMENT

Formation Method of a Resist Pattern

The resist pattern-forming method of the embodiment of the present invention includes the steps of:
(1) providing a resist underlayer film on a substrate using a composition for forming a resist underlayer film;
(2) providing a resist film on the resist underlayer film using a photoresist composition;
(3) exposing the resist film; and
(4) developing the exposed resist film using a developer solution containing no less than 80% by mass of an organic solvent,
in which the composition for forming a resist underlayer film contains the component (A).

Hereinafter, each step in the resist pattern-forming method, and the composition for forming a resist underlayer film used in the resist pattern-forming method will be explained.

Step (1)

In the step (1), a resist underlayer film is provided on a substrate using a composition for forming a resist underlayer film. As the substrate, for example, conventionally well-known substrates such as a silicon wafer and a wafer coated with aluminum can be used. In addition, organic antireflective films disclosed in, for example, Japanese Examined Patent Application, Publication No. H06-12452, Japanese Unexamined Patent Application, Publication No. S59-93448, and the like may be provided on the substrate.

A coating method of the composition for forming a resist underlayer film is exemplified by spin-coating, cast coating, roll coating, and the like. It is to be noted that the film thickness of the resist underlayer film provided is typically 10 nm to 1,000 nm, preferably 10 nm to 500 nm, and more preferably 10 nm to 100 nm.

After coating and the like of the composition for forming a resist underlayer film, a solvent in the coating film may be volatilized as needed by prebaking (PB). The PB temperature is appropriately selected depending on the formulation of the composition for forming a resist underlayer film, and is typically about 50° C. to 450° C. In addition, the PB time is typically about 5 seconds to 600 seconds.

Step (2)

In the step (2), a resist film is provided on the resist underlayer film provided in the step (1) using a photoresist composition. The photoresist composition used in the resist pattern-forming method is preferably a composition in which a polymer, etc. that configures the resist pattern formed generates a polar group such as a hydroxyl group or a carboxyl group after development with the organic solvent. The photoresist composition is exemplified by a composition that includes a polymer component having an acid-dissociable group and a component that generates an acid by exposure, and the like. The acid-dissociable group is exemplified by a group that is dissociated by an action of an acid and generates a polar group such as a carboxyl group or a hydroxyl group, and a group that generates a carboxyl group is preferred. It is believed that due to use of such a photoresist composition an appropriate interaction between the resist pattern formed by development with the organic solvent and the resist underlayer film can be achieved, whereby the pattern collapse resistance can be improved.

The coating method and the coating film thickness of the photoresist composition are similar to those in the composition for forming a resist underlayer film in the step (1). In addition, the temperature of PB that is carried out as needed is appropriately selected depending on the formulation of the photoresist composition, and is typically about 30° C. to 200° C. and preferably 50° C. to 150° C. In addition, the time of PB is typically about 5 seconds to 600 seconds.

A protective film as disclosed in Japanese Patent Application Publication No. H05-188598 or the like may be provided on the resist film so that the resist film is not affected by basic impurities and the like contained in the environmental atmosphere. In order to prevent outflow of the acid generator and the like from the resist film, a liquid immersion lithography protective film as disclosed in Japanese Patent Application Publication No. 2005-352384 or the like may be provided on the resist film. These techniques may be used in combination.
Step (3)

In the step (3), the resist film provided in the step (2) is exposed. The exposure is carried out at desired regions through a mask having a specific pattern and a liquid immersion liquid as needed. Examples of the immersion liquid used for exposure include water, a fluorine-containing inert liquid, and the like. It is preferred that the immersion liquid be transparent to the exposure wavelength, and has a temperature coefficient of the refractive index as small as possible so that distortion of an optical image projected onto the film is minimized. When using an ArF excimer laser (wavelength: 193 nm) as the exposure light source, it is preferred to use water from the viewpoint of availability and ease of handling, in addition to the viewpoints described above. As the water used, a distilled water and an ultra pure water are preferred.

The exposure light used for the exposure is exemplified by electromagnetic waves such as an ultraviolet ray, a far ultraviolet ray, an X-ray and a γ-ray; charged particle rays such as an electron beam and an α-ray, and the like. Among these, a far ultraviolet ray is preferred, an ArF excimer laser beam and a KrF excimer laser beam (wavelength: 248 nm) are more preferred, and an ArF excimer laser beam is further preferred. The exposure conditions such as an exposure dose are appropriately selected in accordance with the formulation, etc. of the photoresist composition.

In addition, it is preferred that post-exposure baking (PEB) is carried out after the exposure. Due to carrying out the PEB, a dissociate reaction, etc. of an acid-dissociable group of a polymer in the photoresist composition can smoothly proceed. The PEB temperature is typically 30° C. to 200° C., and preferably 50° C. to 170° C. In addition, the PEB time is typically 5 seconds to 600 seconds, and preferably 10 seconds to 300 seconds.
Step (4)

In the step (4), the resist film exposed in the step (3) is developed using a developer solution containing no less than 80% by mass of an organic solvent. According to the development carried out using the organic solvent in which a developer solution containing no less than 80% by mass of an organic solvent is used, a polarity becomes higher at light-exposed sites of the resist film and solubility in the organic solvent is decreased. Therefore, the light-exposed sites configure the resist pattern after development with the organic solvent, and as a result, a negative type resist pattern is obtained. According to the resist pattern-forming method, in the case where such development with the organic solvent, a resist pattern excellent in pattern collapse resistance can be formed.

The proportion of the organic solvent contained in the developer solution is no less than 80% by mass. In light of obtaining a favorable resist pattern, the proportion of the organic solvent contained in the developer solution is preferably no less than 85% by mass, and more preferably no less than 90% by mass.

The organic solvent contained in the developer solution is exemplified by an alcohol solvent, an ether solvent, a ketone organic solvent, an amide solvent, an ester organic solvent, a hydrocarbon solvent, and the like. These solvents are exemplified by solvents exemplified as (D) a solvent used for a composition for forming a resist underlayer film described later, and the like. Among these, the organic solvent used for a developer solution is preferably an alcohol solvent, an ether solvent, a ketone solvent, an ester solvent, more preferably an ester solvent, further preferably n-butyl acetate, isopropyl acetate, n-butyl acetate and amyl acetate, and particularly preferably n-butyl acetate. These organic solvents may be used either one type alone, or two or more types in combination.

A surfactant may be added to the developer solution in an appropriate amount as needed. As the surfactant, for example, an ionic or nonionic fluorochemical surfactant and/or a silicon surfactant, and the like may be used.

Examples of the development method include a dipping method that immerses the substrate in a container filled with the developer for a given time, a puddle method that allows the developer to be present on the surface of the substrate due to surface tension for a given time, a spraying method that sprays the developer onto the surface of the substrate, a dynamic dispensing method that applies the developer to the substrate that is rotated at a constant speed while scanning with a developer application nozzle at a constant speed, and the like.

The resist pattern formed after the development may be rinsed with a rinse agent. An alkane solvent, a ketone solvent, an ester solvent, an alcohol solvent, an amide solvent, and the like are preferred as the rinse agent. Among these, an alcohol solvent and an ester solvent are preferred, a monohydric alcohol solvent having 6 to 8 carbon atoms is more preferably, and methylisobutylcarbinol is further preferred. Each component of the rinse agent may be used either alone, or two or more types in combination.

Examples of the rinsing method using the rinse agent include a spinning method that applies the rinse agent to the substrate that is rotated at a constant speed, a dipping method that immerses the substrate in a container filled with the rinse agent for a given time, a spraying method that sprays the rinse agent onto the surface of the substrate, and the like.

After the development or the washing with the rinse agent, a desired resist pattern can be obtained by typically carrying out a dry treatment, etc.
Composition for Forming a Resist Underlayer Film The composition for forming a resist underlayer film used for the resist pattern-forming method contains (A) a component. In addition, the composition for forming a resist underlayer film may contain (B) a nitrogen-containing compound, (C) an acid generating agent, (D) a solvent, and other component within the range not to impair the effects of the resist pattern-forming method. Hereinafter, each component will be explained.

Component (A)

The component (A) is a component that includes a polysiloxane chain and has a carboxyl group, a group that can generate a carboxyl group by an action of an acid, an acid anhydride group or a combination thereof (hereinafter, may be also referred to as "specific group (a)"). The polysiloxane chain is referred to a polymer chain or an oligomer chain having a siloxane bond. The carboxyl group is a monovalent group represented as —COOH. The group that can generate a carboxyl group by an action of an acid is referred to a group obtained by substituting for a hydrogen atom of the carboxyl group by an acid-dissociable group. The term "acid-dissociable group" is referred to a group that substitutes for a hydrogen atom of the carboxyl group and a group that can be dissociated by an action of an acid. The acid anhydride group is referred to a group formed by removing a part or all hydrogen atoms contained in the carboxylic acid anhydride compound, and an acid anhydride group having a valency of n is formed by removing n (n is an integer of 1 or more) hydrogen atoms. The n is preferably 1 or 2, and more preferably 1.

The component (A) is a component that includes a polysiloxane chain and (a) a specific group, and examples of containing thereof include the following aspects (i), (ii), and the like.

(i) a component (hereinafter, may be also referred to as "component (A1)") that includes (a) a polysiloxane (hereinafter, may be also referred to as "polysiloxane (a)")) having a carboxyl group, a group that can generate a carboxyl group by an action of an acid, an acid anhydride group or a combination thereof;

(ii) a component (hereinafter, may be also referred to as "component (A2)") that includes (b) a vinyl polymer (hereinafter, may be also referred to as "vinyl polymer (b)") having a carboxyl group, a group that can generate a carboxyl group by an action of an acid, an acid anhydride group or a combination thereof, and (c) a polysiloxane.

The term "vinyl polymer" is referred to a polymer obtained by polymerizing monomers having a vinyl monomer (polymerizable compound having $CH_2=CH-$) as a principal component.

The group that can generate a carboxyl group by an action of an acid contained in the component (A) is exemplified by a group represented by the following formula (p), and the like.

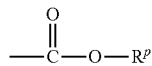
(p)

In the above formula (p), $R^p$ represents a monovalent acid-dissociable group.

The monovalent acid-dissociable group represented by the $R^p$ is exemplified by a group represented by the following formula (p-i), and the like.

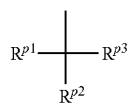
(p-i)

In the above formula (p-i), $R^{p1}$ represents an alkyl group having 1 to 10 carbon atoms or a cycloalkyl group having 3 to 20 carbon atoms; $R^{p2}$ and $R^{p3}$ each independently represent an alkyl group having 1 to 10 carbon atoms or a cycloalkyl group having 3 to 20 carbon atoms, or $R^{p2}$ and $R^{p3}$ may taken together represent a ring structure having 3 to 20 ring members together with the carbon atom to which $R^{p2}$ and $R^{p3}$ bond.

The group represented by the above formula (p) is exemplified by groups represented by the following formulae (p-1) to (p-4), and the like.

(p-1)

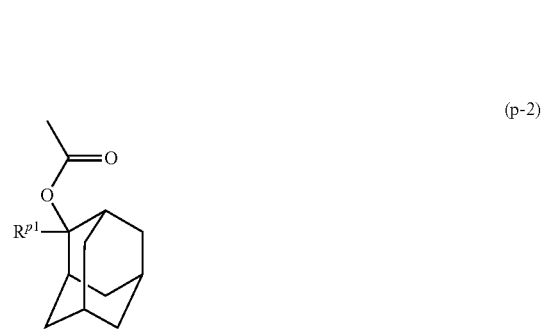
(p-2)

(p-3)

(p-4)

In the above formulae (p-1) to (p-4), $R^{p1}$, $R^{p2}$ and $R^{p3}$ are as defined in the above formula (p-i); and j is an integer of 1 to 4.

The groups represented by the above formulae (p-1) to (p-4) are exemplified by groups represented by the following formulae, and the like.

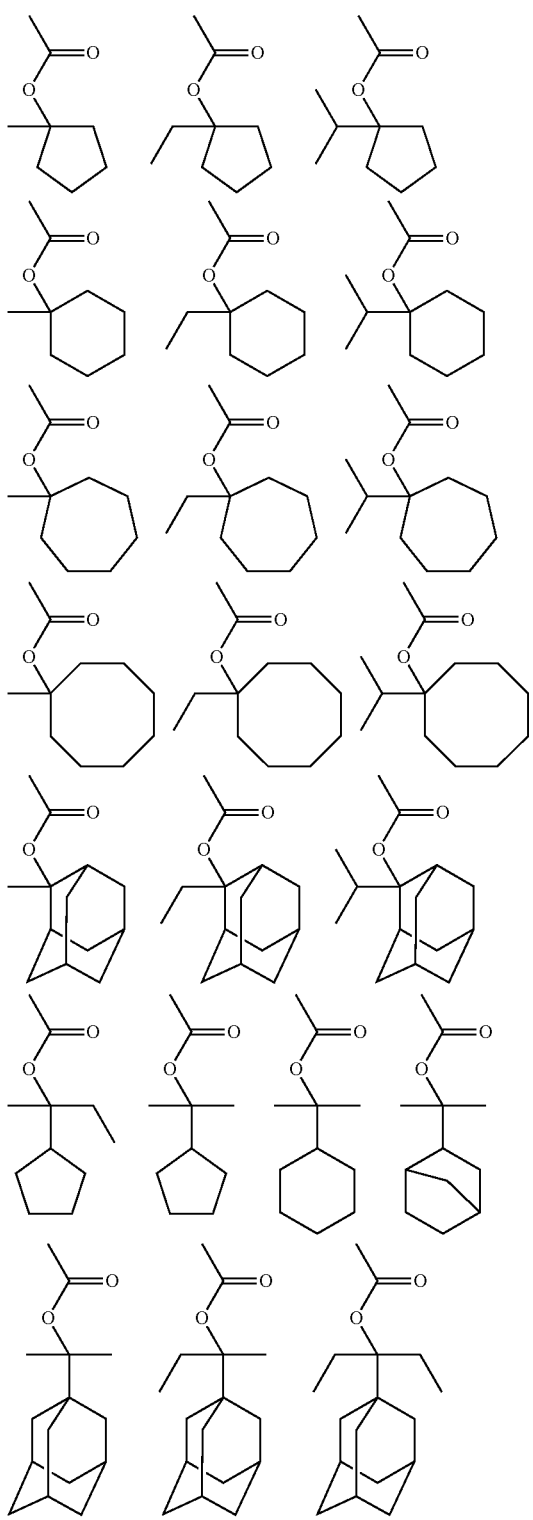

Among these, the group that can generate a carboxyl group by an action of an acid, the group represented by the above formula (p-1) is preferably the group represented by the above formula (p-2), more preferably the group represented by the above formula (p-1), further preferably a (1-alkyl-1-cyclopentyl)oxycarbonyl group, and particularly preferably a (1-i-propyl-1-cyclopentyl)oxycarbonyl group.

Examples of the acid anhydride group contained in the component (A) include aliphatic saturated monocarboxylic acid anhydride groups such as an acetic acid anhydride group, a propionic acid anhydride group and an acetic acid-propionic acid anhydride group; aliphatic unsaturated monocarboxylic acid anhydride groups such as an (meth)acrylic acid anhydride group; monocarboxylic acid anhydride groups such as aromatic monocarboxylic acid anhydride groups such as a benzoic acid anhydride group; aliphatic saturated dicarboxylic acid anhydride groups such as a succinic acid anhydride group, a glutaric acid anhydride group, an adipic acid anhydride group, a sebacic acid anhydride group; aliphatic unsaturated dicarboxylic acid anhydride groups such as a maleic acid anhydride group; dicarboxylic acid anhydride groups such as aromatic dicarboxylic acid anhydride groups such as a phthalic acid anhydride group; anhydride groups of carboxylic acids having a valency of three or more such as a pyromellitic acid dianhydride group, a cyclohexanetetracarboxylic acid dianhydride group, and the like.

Among these, the acid anhydride group is preferably a dicarboxylic acid anhydride group and an anhydride group of carboxylic acid having a valency of 3 or more, more preferably a dicarboxylic acid anhydride group and further preferably aliphatic saturated dicarboxylic acid anhydride groups in light of a stronger interaction with a carboxyl group, etc. in the resist pattern that is generated by development with the organic solvent. Among these, a succinic acid anhydride group is particularly preferred in light of being an acid anhydride group having a 5-membered ring.

In the polysiloxane (a), the binding site of the carboxyl group, the group that can generate a carboxyl group by an action of an acid and the acid anhydride group in the polysiloxane (a) is not particularly limited, and the carboxyl group, the group that can generate a carboxyl group by an action of an acid and the acid anhydride group may directly bond to a silicon atom of the polysiloxane (a), or may bond to a silicon atom of the polysiloxane (A) via a linking group. In addition, one or more carboxyl group(s), the group that can generate a carboxyl group by an action of an acid and/or the acid anhydride group may bond to the linking group. The linking group is not particularly limited, and examples of the linking group include an organic group having a valency of (m+1) in the case in which m carboxyl groups bond (m is an integer of 1 or more), an organic group having a valency of (nk+1) in the case in which k acid anhydride groups having a valency of n bond, and the like. These organic groups are exemplified by a chain-like hydrocarbon group, an alicyclic hydrocarbon group, an aromatic hydrocarbon group, and a group obtained by combination of these groups and one or two selected from —O—, —N—, —S—, —C(=O)—, —C(=S)—, and the like. Among these, the linking group is preferably a bivalent or trivalent chain-like hydrocarbon group, more preferably a methanediyl group, an ethanediyl group, a propanediyl group, a butanediyl group, a pentanediyl group, a hexanediyl group, a propanetriyl group, a butanetriyl group, a pentanetriyl group and a hexanetriyl group, and particularly preferably a 1,3-propanediyl group and a 1,5,5-pentanetriyl group.

Hereinafter, (A1) a component and (A2) a component will be explained.

Component (A1)

The component (A1) is a component containing the polysiloxane (a). In addition, the component (A1) may contain a polysiloxane (hereinafter, may be also referred to as "polysiloxane (d)") not having the specific group (a) in addition to the polysiloxane (a).

According to the resist pattern-forming method, it is believed that since the composition for forming a resist underlayer film contains the polysiloxane (a) as the component (A) an appropriate interaction occurs with a carboxyl group, etc. that is generated in the resist pattern on the resist underlayer film in development with the organic solvent. As a result, the pattern collapse resistance of the resist pattern becomes excellent.

Polysiloxane (a)

The polysiloxane (a) is a polysiloxane having a carboxyl group, a group that can generate a carboxyl group by an action of an acid, an acid anhydride group or a combination thereof. The polysiloxane (a) is not particularly limited as long as it includes a polysiloxane chain and the polysiloxane chain has the specific group (a).

The polysiloxane (a) is preferably a hydrolytic condensation product of a compound that includes a silane compound (hereinafter, may be also referred to as "silane compound (1)") represented by the following formula (1).

$$R^1_a R^2_b SiX_{4-a-b} \quad (1)$$

In the above formula (1), $R^1$ represents a monovalent organic group that includes a carboxyl group, a group that can generate a carboxyl group by an action of an acid or an acid anhydride group; $R^2$ represents a hydrogen atom, a fluorine atom, an alkyl group having 1 to 5 carbon atoms, a cyano group, a cyanoalkyl group, an alkylcarbonyloxy group, an alkenyl group or an aryl group; X represents a halogen atom or $—OR^3$, wherein $R^3$ represents a monovalent organic group; a is an integer of 1 to 3; b is an integer of 0 to 2, wherein an inequality of $1 \leq (a+b) \leq 3$ is satisfied.

The monovalent organic group that includes a carboxyl group, a group that can generate a carboxyl group by an action of an acid or an acid anhydride group represented by the $R^1$ is exemplified by a group represented by the following formula (2), a group represented by the following formula (3), a group represented by the following formula (4), and the like.

(2)

(3)

(4)

In the above formula (2), $R^A$ represents a hydrocarbon group having a valency of (p+1), a hetero atom-containing group that includes at least one selected from the group consisting of —CO—, —COO—, —O—, —NR—, —CS—, —S—, —SO— and —SO$_2$— between carbon-carbon of the hydrocarbon group, or a group obtained by substituting a part or all of hydrogen atoms contained in the hydrocarbon group and the hetero atom-containing group by a substituent; and p is an integer of 1 to 5.

In the above formula (3), $R^B$ represents a hydrocarbon group having a valency of (q+1), a hetero atom-containing group that includes at least one selected from the group consisting of —CO—, —COO—, —O—, —NR—, —CS—, —S—, —SO— and —SO$_2$— between carbon-carbon of the hydrocarbon group, or a group obtained by substituting a part or all of hydrogen atoms contained in the hydrocarbon group and the hetero atom-containing group by a substituent; $R^P$ represents a monovalent acid-dissociated group; and q is an integer of 1 to 5.

In the above formula (4), $R^C$ represents a monovalent hydrocarbon group, a hetero atom-containing group that includes at least one selected from the group consisting of —CO—, —COO—, —O—, —NR—, —CS—, —S—, —SO— and —SO$_2$— between carbon-carbon of the hydrocarbon group, or a group obtained by substituting a part or all of hydrogen atoms contained in the hydrocarbon group and the hetero atom-containing group by a substituent; $R^D$ represents a hydrocarbon group having a valency of (r+1), a hetero atom-containing group that includes at least one selected from the group consisting of —CO—, —COO—, —O—, —NR—, —CS—, —S—, —SO— and —SO$_2$— between carbon-carbon of the hydrocarbon group, or a group obtained by substituting a part or all of hydrogen atoms contained in the hydrocarbon group and the hetero atom-containing group by a substituent; r is an integer of 1 to 5; wherein provided that $R^C$ is present in a plurality of number, the plurality of $R^C$s may be the same or different. In addition, $R^C$ and $R^D$ may taken together represent a dicarboxylic acid anhydride group together with —CO—O—CO—.

The hydrocarbon group having a valency of (p+1) represented by the $R^A$, the hydrocarbon group having a valency of (q+1) represented by the $R^B$ and the hydrocarbon group having a valency of (r+1) represented by the $R^D$ are exemplified by chain-like saturated hydrocarbons such as methane, ethane, propane, butane, pentane and hexane; chain-like unsaturated hydrocarbons such as ethylene, propylene and butylene; alicyclic saturated hydrocarbons such as cyclopentane and cyclohexane; alicyclic unsaturated hydrocarbons such as cyclopentene and cyclohexene; groups obtained by removing (p+1), (q+1) or (r+1) hydrogen atoms from aromatic hydrocarbons such as benzene, naphthalene and toluene, and the like. Among these, $R^A$, $R^B$ and $R^D$ are preferably a group obtained by removing a hydrogen atom from a chain-like saturated hydrocarbon, more preferably a chain-like saturated hydrocarbon group having 2 to 6 carbon atoms, and further preferably a chain-like saturated hydrocarbon group having 3 to 5 carbon atoms in light of a stronger interaction between the resist underlayer film and the resist pattern due to an appropriate distance between a carboxyl group, etc., and a silicon atom of the polysiloxane (A), and mobility of the carboxyl group, etc.

Examples of the hetero atom-containing group that includes at least one selected from the group consisting of —CO—, —COO—, —O—, —NR—, —CS—, —S—, —SO— and —SO$_2$— between carbon-carbon of the hydrocarbon group represented by the $R^A$, $R^B$, $R^C$ and $R^D$, typified by a bivalent hetero atom-containing group, include an oxoalkylene group, an alkylenecarbonyloxyalkylene group, an alkyleneoxyalkylene group, an alkyleneiminoalkylene group, a thioxoalkylene group, an alkylenesulfanilalkylene group, an alkylenesulfinylalkylene group, an alkylenesulfonylalkylene group, a cyclic ketone-diyl group, a lactone-diyl group, a cyclic ether group, a cyclic imino group, a cyclic thioketone-diyl group, a cyclic thio ether group, a cyclic sulfoxide group, a cyclic sulfone group, and the like.

Examples of the monovalent hydrocarbon group represented by the $R^C$ include alkyl groups such as a methyl group and an ethyl group; monovalent alicyclic hydrocarbon groups such as a cyclopentyl group, a cyclohexyl group, a norbornyl group and an adamantyl group; aryl groups such as a phenyl group, a naphthyl group and a tolyl group; aralkyl groups such as a benzyl group and a phenethyl group, and the like.

Examples of the substituent that may substitute for the hydrocarbon group represented by the $R^A$, $R^B$, $R^C$ and $R^D$ include halogen atoms such as a fluorine atom, a chlorine atom, a bromine atom and an iodine atom; a hydroxyl group, a cyano group, an alkoxy group, an acyl group, an acyloxy group, and the like.

Examples of the dicarboxylic acid anhydride group in which $R^C$ and $R^D$ may taken together represent together with —CO—O—CO— include a succinic acid anhydride group, a glutaric acid anhydride group, an adipic acid anhydride group, a maleic acid anhydride group, a norbornane-2,3-carboxylic acid anhydride group, a phthalic acid anhydride group, and the like.

With respect to the monovalent organic group that includes a carboxyl group, a group that can generate a carboxyl group by an action of an acid or an acid anhydride group represented by the $R^1$, examples of a group that includes one carboxyl group include carboxyl group-containing alkyl groups such as a carboxymethyl group, a 1-carboxy-2-ethyl group, a 1-carboxy-3-propyl group, a 1-carboxy-4-butyl group and a 1-carboxy-5-pentyl group;
carboxyl group-containing alicyclic hydrocarbon groups such as a carboxycyclopentyl group, a carboxycyclohexyl group, a carboxynorbornyl group and a carboxyadamantyl group;
carboxyl group-containing aryl groups such as a carboxyphenyl group, a carboxytolyl group and a carboxynaphthyl group, or groups obtained by bonding of a substituent to these groups, and the like.

Examples of the group that includes two carboxyl groups include carboxyl group-containing alkyl groups such as a dicarboxymethyl group, a 1,2-dicarboxy-2-ethyl group, a 1,2-dicarboxy-3-propyl group, a 1,3-dicarboxy-3-propyl group, a 1,2-dicarboxy-4-butyl group and a 1,3-dicarboxy-4-butyl group;
carboxyl group-containing alicyclic hydrocarbon groups such as a dicarboxycyclopentyl group, a dicarboxycyclohexyl group and a dicarboxynorbornyl group;
carboxyl group-containing aryl groups such as a carboxyphenyl group, a carboxytolyl group, a carboxynaphthyl group, or groups obtained by bonding of a substituent to these groups, and the like.

Examples of the group that includes a group that can generate a carboxyl group by an action of one acid include a 2-(1-i-propyl-1-cyclopentyloxycarbonyl)propylsulfanilpropyl group, a 1-ethyl-1-cyclopentyloxycarbonylpropyl group, a 2-ethyl-2-adamantyloxycarbonylethyl group and a 2-(methoxydiethylmethyloxycarbonyl)propylsulfanilpropyl group, or groups obtained by bonding of a substituent to these groups, and the like.

Examples of the group that includes a group that can generate a carboxyl group by an action of two acids include a 2,3-di(1-i-propyl-1-cyclopentyloxycarbonyl)propylsulfanilpropyl group and a 3,5-di(1-ethyl-1-cyclopentyloxycarbonyl)cyclohexyl group, or groups obtained by bonding of a substituent to these groups, and the like.

Examples of the group that includes one acid anhydride group include a 2,5-diketotetrahydrofuranylmethyl group, a 2,5-diketotetrahydrofuranylethyl group and a 2,5-diketotetrahydrofuranylpropyl group, or groups obtained by bonding of a substituent to these groups, and the like.

Among these, the $R^1$ preferably represents a group that includes 1 or 2 carboxyl group, a group that can generate a carboxyl group by an action of one acid or a group that includes one acid anhydride group, more preferably represents a group that includes two carboxyl group, a group that can generate a carboxyl group by an action of one acid or a group that includes one acid anhydride group, further preferably represents an alkyl group that includes two carboxyl groups, an alkyl group that includes a group that can generate a carboxyl group by an action of one acid or an alkyl group that includes one acid anhydride group, and particularly preferably represents a 4,5-dicarboxy-1-pentyl group, a 2-(1-i-propyl-1-cyclopentyloxycarbonyl)propylsulfanilpropyl group or a 3-(2,5-diketotetrahydrofuran-3-yl)propyl group.

Examples of the alkyl group having 1 to 5 carbon atoms represented by the $R^2$ include linear alkyl groups such as a methyl group, an ethyl group, an n-propyl group, an n-butyl group and an n-pentyl group; branched alkyl groups such as an isopropyl group, an isobutyl group, a sec-butyl group, a t-butyl group and an isoamyl group, and the like.

Examples of the cyano alkyl group represented by the $R^2$ include a cyanomethyl group, a cyanoethyl group, and the like.

Examples of the alkenyl group represented by the $R^2$ include a group obtained by removing one hydrogen atom from an alkene compound such as an ethenyl group, a 1-propen-1-yl group, a 1-propen-2-yl group, a 1-propen-3-yl group, a 1-buten-1-yl group, a 1-buten-2-yl group, a 1-buten-3-yl group, a 1-buten-4-yl group, a 2-buten-1-yl group, a 2-buten-2-yl group, a 1-penten-5-yl group, a 2-penten-1-yl group, a 2-penten-2-yl group, a 1-hexen-6-yl group, a 2-hexen-1-yl group, a 2-hexen-2-yl group, and the like.

Examples of the aryl group represented by the $R^2$ include a phenyl group, a naphthyl group, a tolyl group, a xylyl group, a mesityl group, and the like.

$R^2$ preferably represents an alkyl group having 1 to 5 carbon atoms, an alkenyl group and an aryl group, more preferably represents an alkyl group having 1 to 5 carbon atoms and further preferably represents a methyl group and an ethyl group.

Examples of the halogen atom represented by the X include a fluorine atom, a chlorine atom, a bromine atom, an iodine atom, and the like.

Examples of the monovalent organic group represented by $R^3$ in —$OR^3$ as the X include an alkyl group, an alkylcarbonyl group, and the like. The alkyl group is preferably a methyl group, an ethyl group, an n-propyl group, an isopropyl group, an n-butyl group, an isobutyl group, a sec-butyl group and a t-butyl group, more preferably a methyl group and an ethyl group, and further preferably a methyl group. In addition, the alkylcarbonyl group is preferably a methylcarbonyl group and an ethylcarbonyl group, and more preferably a methylcarbonyl group.

X preferably represents —$OR^3$, more preferably an alkoxy group, further preferably a methyl group or an ethyl group, and particularly preferably a methyl group.

The "a" is preferably 1 or 2, and more preferably 1. b is preferably an integer of 0 to 2, more preferably 0 or 1, and further preferably 0. (a+b) is preferably an integer of 1 to 3, more preferably 1 or 2, and further preferably 1.

The silane compound (1) is exemplified by compounds represented by the following formulae, and the like.

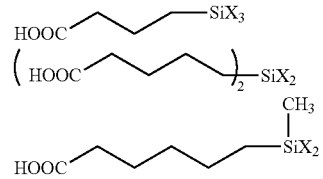

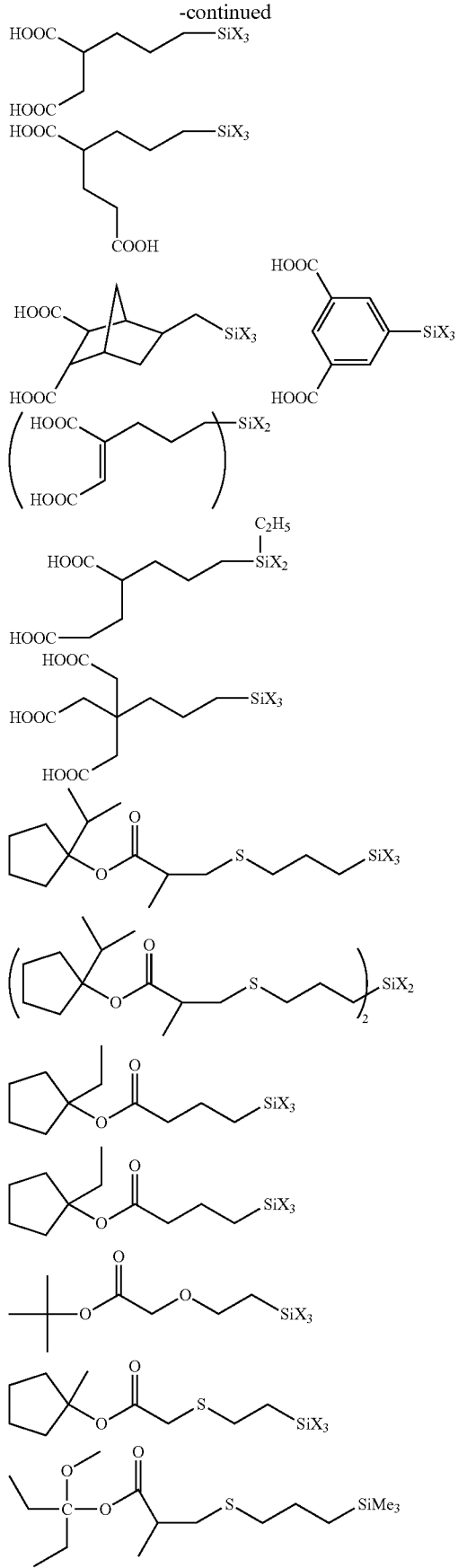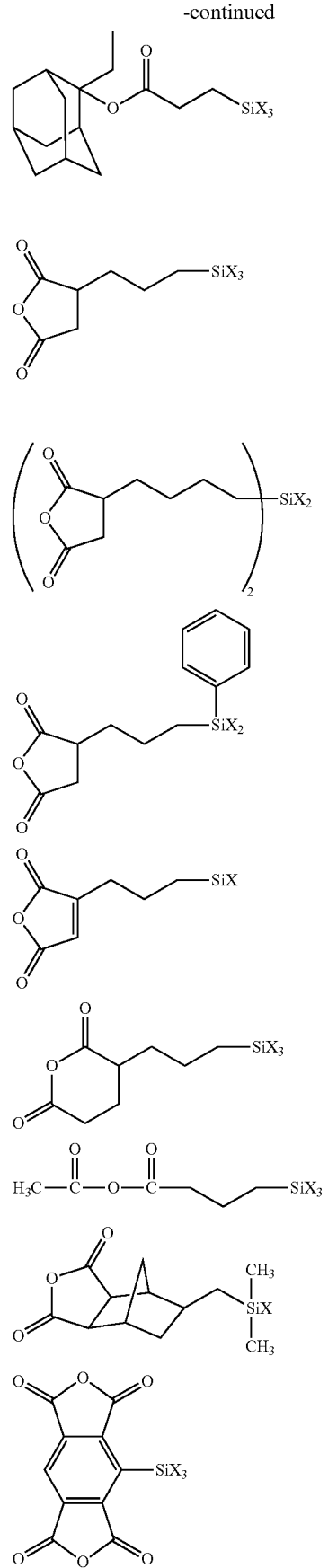

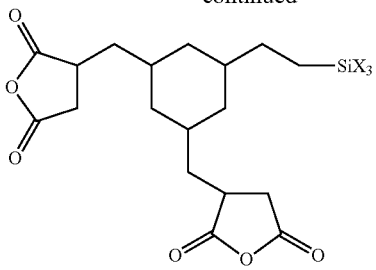

In the above formula, X is as defined in the above formula (1).

Among these, the silane compound having a carboxyl group is preferably a silane compound that has an alkyl group having one or two carboxyl groups and has two or three Xs, more preferably a silane compound that has an alkyl group having two carboxyl groups and has three Xs, and further preferably 4,5-dicarboxypentyltrialkoxysilane. The silane compound having a group that can generate a carboxyl group by an action of an acid is preferably a silane compound that has one alkyl group having a group that can generate a carboxyl group by an action of an acid and has two or three Xs, more preferably a silane compound that has one alkyl group having a group that can generate a carboxyl group by an action of an acid and has three Xs, and further preferably 2-(1-i-propyl-1-cyclopentyl)propylsulfanilpropyltrialkoxysilane. The silane compound having an acid anhydride group is preferably a silane compound that has one alkyl group having an acid anhydride group and two or three Xs, more preferably a silane compound that has an alkyl group having one acid anhydride group and has three Xs, and further preferably 3-(3-(2,5-diketotetrahydrofuranyl))propyltrialkoxysilane.

The silane compound (1) can be conveniently synthesized by, for example, subjecting a silane compound having an alkyl group to which a thiol group bonds to an addition reaction to a (meth)acryl ester compound having the specific group (a) in the presence of amine, etc.

Synthesis Method of Polysiloxane (A)

The polysiloxane (a) can be synthesized by, for example, subjecting the silane compound (1) and other silane compound used as needed to a hydrolytic condensation.

With respect to the other silane compound that may be subjected to the hydrolytic condensation together with the silane compound (1), examples of the silane compound containing one silicon atom include aromatic ring-containing trialkoxysilanes such as phenyltrimethoxysilane, benzyltrimethoxysilane, phenethyltrimethoxysilane, 4-methylphenyltrimethoxysilane, 4-ethylphenyltrimethoxysilane, 4-methoxyphenyltrimethoxysilane, 4-phenoxyphenyltrimethoxysilane, 4-hydroxyphenyltrimethoxysilane, 4-aminophenyltrimethoxysilane, 4-dimethylaminophenyltrimethoxysilane, 4-acetylaminophenyltrimethoxysilane, 3-methylphenyltrimethoxysilane, 3-ethylphenyltrimethoxysilane, 3-methoxyphenyltrimethoxysilane, 3-phenoxyphenyltrimethoxysilane, 3-hydroxyphenyltrimethoxysilane, 3-aminophenyltrimethoxysilane, 3-dimethylaminophenyltrimethoxysilane, 3-acetylaminophenyltrimethoxysilane, 2-methylphenyltrimethoxysilane, 2-ethylphenyltrimethoxysilane, 2-methoxyphenyltrimethoxysilane, 2-phenoxyphenyltrimethoxysilane, 2-hydroxyphenyltrimethoxysilane, 2-aminophenyltrimethoxysilane, 2-dimethylaminophenyltrimethoxysilane, 2-acetylaminophenyltrimethoxysilane, 2,4,6-trimethylphenyltrimethoxysilane, 4-methylbenzyltrimethoxysilane, 4-ethylbenzyltrimethoxysilane, 4-methoxybenzyltrimethoxysilane, 4-phenoxybenzyltrimethoxysilane, 4-hydroxybenzyltrimethoxysilane, 4-aminobenzyltrimethoxysilane, 4-dimethylaminobenzyltrimethoxysilane and 4-acetylaminobenzyltrimethoxysilane; alkyltrialkoxysilanes such as methyltrimethoxysilane, methyltriethoxysilane, methyltri-n-propoxysilane, methyltri-iso-propoxysilane, methyltri-n-butoxysilane, methyltri-sec-butoxysilane, methyltri-t-butoxysilane, methyltriphenoxysilane, methyltriacetoxysilane, methyltrichlorosilane, methyltriisopropenoxysilane, methyltris(dimethylsiloxy)silane, methyltris(methoxyethoxy)silane, methyltris(methylethylketoxime)silane, methyltris(trimethylsiloxy)silane, methylsilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-t-butoxysilane, ethyltriphenoxysilane, ethylbistris(trimethylsiloxy)silane, ethyldichlorosilane, ethyltriacetoxysilane, ethyltrichlorosilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, n-propyltri-t-butoxysilane, n-propyltriphenoxysilane, n-propyltriacetoxysilane, n-propyltrichlorosilane, iso-propyltrimethoxysilane, iso-propyltriethoxysilane, iso-propyltri-n-propoxysilane, iso-propyltri-iso-propoxysilane, iso-propyltri-n-butoxysilane, iso-propyltri-sec-butoxysilane, iso-propyltri-t-butoxysilane, iso-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-sec-butoxysilane, n-butyltri-t-butoxysilane, n-butyltriphenoxysilane, n-butyltrichlorosilane, 2-methylpropyltrimethoxysilane, 2-methylpropyltriethoxysilane, 2-methylpropyltri-n-propoxysilane, 2-methylpropyltri-iso-propoxysilane, 2-methylpropyltri-n-butoxysilane, 2-methylpropyltri-sec-butoxysilane, 2-methylpropyltri-t-butoxysilane, 2-methylpropyltriphenoxysilane, 1-methylpropyltrimethoxysilane, 1-methylpropyltriethoxysilane, 1-methylpropyltri-n-propoxysilane, 1-methylpropyltri-iso-propoxysilane, 1-methylpropyltri-n-butoxysilane, 1-methylpropyltri-sec-butoxysilane, 1-methylpropyltri-t-butoxysilane, 1-methylpropyltriphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-sec-butoxysilane, t-butyltri-t-butoxysilane, t-butyltriphenoxysilane, t-butyltrichlorosilane and t-butyldichlorosilane; alkenyltrialkoxysilanes such as vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-t-butoxysilane, vinyltriphenoxysilane, allyltrimethoxysilane, allyltriethoxysilane, allyltri-n-propoxysilane, allyltriisopropoxysilane, allyltri-n-butoxysilane, allyltri-sec-butoxysilane, allyltri-t-butoxysilane and allyltriphenoxysilane; tetraalkoxysilanes such as tetramethoxysilane, tetraethoxysilane, tetra-n-propoxysilane, tetra-iso-propoxysilane, tetra-n-butoxysilane, tetra-sec-butoxysilane and tetra-t-butoxysilane; tetraarylsilanes such as tetraphenoxysilane; epoxy group-containing silanes such as oxetanyltrimethoxysilane, oxiranyltrimethoxysilane, oxiranylmethyltrimethoxysilane and 3-glycidyloxypropyltrimethoxysilane; tetrahalosilanes such as tetrachlorosilane, and the like.

In addition, examples of the silane compound containing two or more silicon atoms include disilanes such as hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane; bis(trimethoxysilyl)methane, bis(triethoxysilyl)methane, bis(tri-n-propoxysilyl)methane, bis(tri-isopropoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-isopropoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-isopropoxymethylsilyl)-1-(tri-isopropoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-isopropoxymethylsilyl)-2-(tri-isopropoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(di-isopropoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(di-isopropoxymethylsilyl)ethane, 1,2-bis(di-n-butoxymethylsilyl)ethane, 1,2-bis(di-sec-butoxymethylsilyl)ethane, 1,2-bis(di-t-butoxymethylsilyl)ethane, bis(dimethylmethoxysilyl)methane, bis(dimethylethoxysilyl)methane, bis(dimethyl-n-propoxysilyl)methane, bis(dimethyl-isopropoxysilyl)methane, bis(dimethyl-n-butoxysilyl)methane, bis(dimethyl-sec-butoxysilyl)methane, bis(dimethyl-t-butoxysilyl)methane, 1,2-bis(dimethylmethoxysilyl)ethane, 1,2-bis(dimethylethoxysilyl)ethane, 1,2-bis(dimethyl-n-propoxysilyl)ethane, 1,2-bis(dimethyl-isopropoxysilyl)ethane, 1,2-bis(dimethyl-n-butoxysilyl)ethane, 1,2-bis(dimethyl-sec-butoxysilyl)ethane, 1,2-bis(dimethyl-t-butoxysilyl)ethane, 1-(dimethoxymethylsilyl)-1-(trimethylsilyl)methane, 1-(diethoxymethylsilyl)-1-(trimethylsilyl)methane, 1-(di-n-propoxymethylsilyl)-1-(trimethylsilyl)methane, 1-(di-isopropoxymethylsilyl)-1-(trimethylsilyl)methane, 1-(di-n-butoxymethylsilyl)-1-(trimethylsilyl)methane, 1-(di-sec-butoxymethylsilyl)-1-(trimethylsilyl)methane, 1-(di-t-butoxymethylsilyl)-1-(trimethylsilyl)methane, 1-(dimethoxymethylsilyl)-2-(trimethylsilyl)ethane, 1-(diethoxymethylsilyl)-2-(trimethylsilyl)ethane, 1-(di-n-propoxymethylsilyl)-2-(trimethylsilyl)ethane, 1-(di-isopropoxymethylsilyl)-2-(trimethylsilyl)ethane, 1-(di-n-butoxymethylsilyl)-2-(trimethylsilyl)ethane, 1-(di-sec-butoxymethylsilyl)-2-(trimethylsilyl)ethane, 1-(di-t-butoxymethylsilyl)-2-(trimethylsilyl)ethane, 1,2-bis(trimethoxysilyl)benzene, 1,2-bis(triethoxysilyl)benzene, 1,2-bis(tri-n-propoxysilyl)benzene, 1,2-bis(tri-isopropoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-isopropoxysilyl)benzene, 1,3-bis(tri-n-butoxysilyl)benzene, 1,3-bis(tri-sec-butoxysilyl)benzene, 1,3-bis(tri-t-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-isopropoxysilyl)benzene, 1,4-bis(tri-n-butoxysilyl)benzene, 1,4-bis(tri-sec-butoxysilyl)benzene, 1,4-bis(tri-t-butoxysilyl)benzene, and the like.

Additionally, polycarbosilanes such as polydimethoxymethylcarbosilane and polydiethoxymethylcarbosilane, and the like may be used.

Conditions for hydrolytic condensation of the silane compound (1) and the other silane compound are not particularly limited, and the hydrolytic condensation can be carried out as one example as descried below.

The water used for the hydrolytic condensation is preferably purified by methods such as a treatment with a reverse osmosis membrane, an ion exchange treatment and distillation. Due to use of such purified water, side reactions can be inhibited, thereby enabling a reactivity of the hydrolysis to be improved. The amount of the water used is preferably 0.1 to 3 mol, more preferably 0.3 to 2 mol, and further preferably 0.5 to 1.5 mol based on 1 mol of the total amount of a hydrolyzable group of the silane compound (i.e., a group represented by X in the above formula (1)). Use of water having such an amount enables the reaction rate of the hydrolytic condensation to be optimized.

The reaction solvent capable of being used for the hydrolytic condensation is not particularly limited, and typically the reaction solvent similar to that used for a preparation of the composition for forming an underlayer film described later may be used. Examples of the reaction solvent include ethylene glycol monoalkyl ether acetate, diethylene glycol dialkyl ether, propylene glycol monoalkyl ether, propylene glycol monoalkyl ether acetate, propionic acid esters, and the like. Among these reaction solvents, diethylene glycol dimethyl ether, diethylene glycol ethyl methyl ether, propylene glycol monomethyl ether, propylene glycol monoethyl ether, propylene glycol monomethyl ether acetate or methyl 3-methoxypropionate is preferred.

The hydrolytic condensation reaction is preferably carried out in the presence of a catalyst such as a catalyst of an acid (for example, hydrochloric acid, sulfuric acid, nitric acid, formic acid, oxalic acid, acetic acid, trifluoroacetic acid, trifluoromethane sulfonic acid, phosphoric acid, acidic ion exchange resin and various types of Lewis acid), a catalyst of a base (for example, nitrogen-containing compounds such as ammonia, primary amines, secondary amines, tertiary amines and pyridine; basic ion exchange resin; hydroxides such as sodium hydroxide; carbonates such as potassium carbonate; carboxylates such as sodium acetate; various types of Lewis base), alkoxides (for example, zirconium alkoxide, titanium alkoxide, aluminum alkoxide). The amount of the catalyst used is preferably no greater than 0.2 mol, and more preferably 0.00001 to 0.1 mol based on 1 mol of a silane compound in light of promotion of the hydrolytic condensation reaction.

The reaction temperature and the reaction time are appropriately set in the hydrolytic condensation. The reaction temperature is preferably 40 to 200° C., and more preferably 50 to 150° C. The reaction time is preferably 30 minutes to 24 hours and more preferably 1 to 12 hours. Such a reaction temperature and a reaction time enable the hydrolytic condensation reaction to be most efficiently carried out. In the hydrolytic condensation, the hydrolytic condensation reaction may be carried out in one step by adding a silane compound, water and a catalyst in the reaction system at one time, or in a multiple step by adding a silane compound, water and a catalyst in the reaction system at several times. It is to be noted that water and generated alcohol can be removed from the reaction system by subjecting the water and the generated alcohol to evaporation after the hydrolytic condensation reaction.

The proportion of the silane compound (1) used for forming the polysiloxane (a) is preferably 0.1 mol % to 30 mol %, more preferably 0.5 mol % to 20 mol %, and further preferably 1 mol % to 15 mol % based on the number of silicon atoms of all the silane compounds used for the hydrolytic condensation. When the proportion of the silane compound (1) used is less than the lower limit, the pattern collapse resistance of the resist pattern formed may be deteriorated. When the proportion of the silane compound (1) used exceeds the upper limit, the resist pattern shape formed may be less favorable.

The polystyrene equivalent weight average molecular weight (Mw) of the polysiloxane (a) as determined by gel permeation chromatography (GPC) is typically 500 to 20,000, preferably 800 to 15,000, more preferably 1,000 to 10,000, and further preferably 1,200 to 5,000.

It is to be noted that the Mw herein is a value determined by the gel permeation chromatography (GPC) on the basis of mono-dispersion polystyrene under the analysis condition involving: a flow rate of 1.0 mL/min of; an elution solvent of tetrahydrofuran; and a column temperature of 40° C., using GPC columns (G2000HXL×2, G3000HXL×1, G4000HXL×1, manufactured by Tosoh Corporation).

With respect to the proportion of the polysiloxane (a) included in the component (A1), the proportion of the mass of the polysiloxane (a) is preferably 5% by mass to 100% by mass, more preferably 20% by mass to 100% by mass, and further preferably 50% by mass to 100% by mass based on the sum of the masses of the polysiloxane (a) and the polysiloxane (d).

The content of the polysiloxane (a) in the composition for forming a resist underlayer film is typically no less than 80% by mass, preferably 85% by mass, and more preferably no less than 90% by mass based on the total solid contents. When the content of the polysiloxane (a) is less than the lower limit, the hardness of the resist underlayer film provided may be deteriorated.

Component (A2)

The component (A2) is a component that includes (b) a vinyl polymer and (c) a polysiloxane.

According to the resist pattern-forming method, due to inclusion of the specific polymer and the specific polysiloxane as the component (A), the specific polymer is unevenly distributed on the surface of the resist underlayer film, whereby the abundance ratio of a carboxyl group, etc. on the surface can be increased. As a result, the pattern collapse resistance of the resist pattern becomes more excellent.

The vinyl polymer (b) and the polysiloxane (c) may bond via, for example, a siloxane bond to join (hereinafter, the component (A2) in this case may also be referred to as "(b) a polysiloxane that includes a vinyl polymer").

Hereinafter, the vinyl polymer (b) and the polysiloxane (c) will be explained.

Vinyl Polymer (b)

The vinyl polymer (b) is a vinyl polymer having the specific group (a). The binding position of the specific group (a) in the vinyl polymer (b) is not particularly limited, and the specific group (a) may bond to anywhere of a main chain, side chain or terminal, etc. of the vinyl polymer.

The vinyl polymer (b) is exemplified by a polymer having a structural unit represented by the following formula (x) (hereinafter, may be also referred to as "structural unit (I)"), and the like.

(x)

In the above formula (x), $R^a$ represents a hydrogen atom, a fluorine atom, a methyl group or a trifluoromethyl group; $L^1$ represents a single bond or a bivalent linking group; and $R^q$ represents a monovalent specific group (a).

The $R^a$ preferably represents a hydrogen atom or a methyl group, and more preferably a methyl group in light of the degree of copolymerization of monomers that give the structural unit (I).

The bivalent linking group represented by the $L^1$ is exemplified by —COO—, —CONH—, and the like, and is exemplified by a group obtained by a combination of these groups with an alkanediyl group, a cycloalkanediyl group, and the like, and the like.

The monovalent specific group represented by the $R^q$ is exemplified by respective groups exemplified as the specific group (a) contained in the component (A) described above, and the like.

The structural unit (I) is exemplified by structural units represented by the following formulae, and the like.

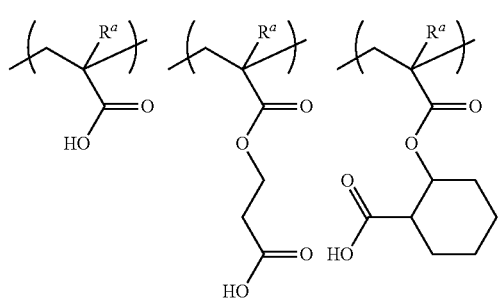

-continued

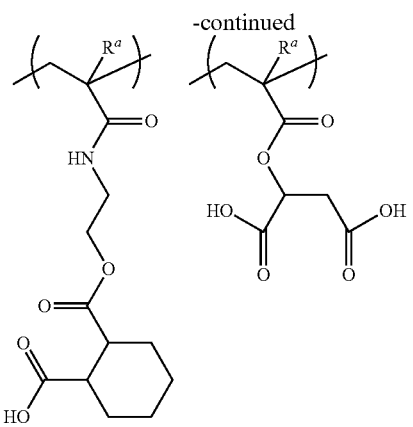

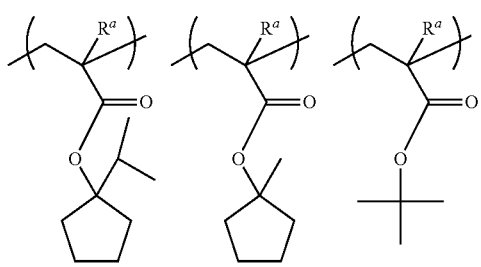

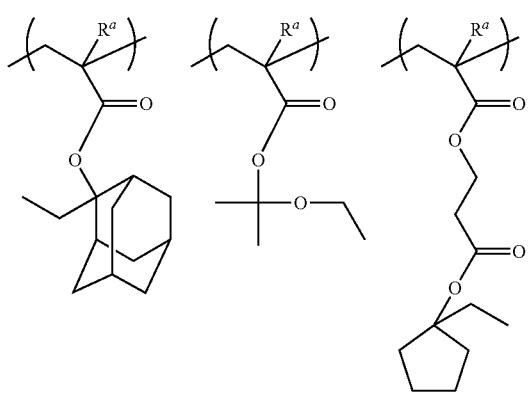

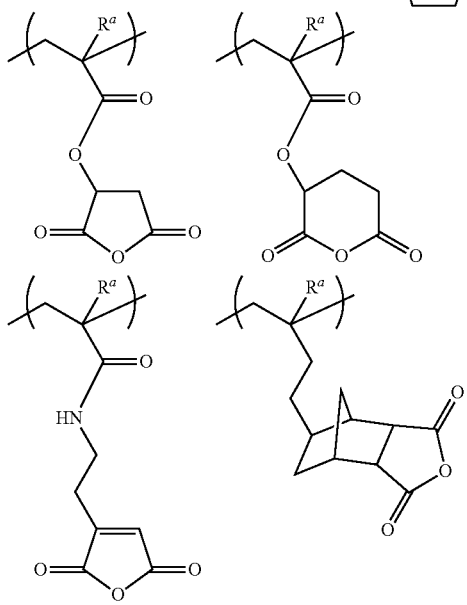

In the above formula, $R^a$ is as defined in the above formula (x).

The structural unit (I) is preferably a structural unit that includes a group that can generate a carboxyl group by an action of an acid, more preferably a structural unit derived from an ester having a tertiary cycloalkyl group, further preferably a structural unit derived from 1-alkyl-1-cycloalkyl (meth)acrylate, and particularly preferably a structural unit derived from 1-i-propyl-1-cyclopentyl (meth)acrylate.

The vinyl polymer (b) preferably further has a silicon-containing group. Due to the vinyl polymer (b) further having a silicon atom-containing group, an affinity to the polysiloxane (c) is enhanced. As a result, the pattern collapse resistance of the resist pattern can be improved.

The structural unit that includes a silicon-containing group (hereinafter, may be also referred to as "structural unit (II)") is exemplified by a structural unit represented by the following formula (y), and the like.

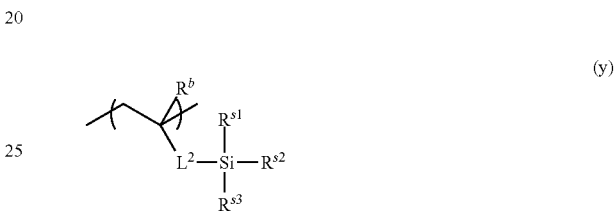

(y)

In the above formula (y), $R^b$ represents a hydrogen atom, a fluorine atom, a methyl group or a trifluoromethyl group; $L^2$ represents a bivalent linking group; and $R^{s1}$, $R^{s2}$ and $R^{s3}$ each independently represent a monovalent hydrocarbon group, a monovalent oxyhydrocarbon group or a halogen atom.

The $R^b$ preferably represents a hydrogen atom or a methyl group, and more preferably a methyl group in light of the degree of copolymerization of monomers that give the structural unit (II).

The bivalent linking group represented by the $L^2$ is exemplified by a group similar to the bivalent linking group exemplified as the $L^1$ described above, and the like.

Among these, the $L^2$ is preferably —COO— and —COO—C$_3$H$_6$—, and more preferably —COO—C$_3$H$_6$—.

Examples of the monovalent hydrocarbon group represented by the $R^{s1}$, $R^{s2}$ and $R^{s3}$ include alkyl groups such as a methyl group, an ethyl group, a propyl group and a butyl group;
alkenyl groups such as an ethenyl group, a propenyl group and a butenyl group;
monovalent chain-like hydrocarbon groups such as alkynyl groups such as an ethynyl group, a propynyl group and a butynyl group;
monocyclic cycloalkyl groups such as a cyclopropyl group, a cyclobutyl group, a cyclopentyl group and a cyclohexyl group;
monocyclic cycloalkenyl groups such as a cyclopropenyl group, a cyclobutenyl group and a cyclopentenyl group;
polycyclic cycloalkyl groups such as a norbornyl group, an adamantyl group, a tricyclodecanyl group and a tetracyclododecyl group;
monovalent alicyclic hydrocarbon groups such as polycyclic cycloalkenyl groups such as a norbornenyl group, a tricyclodecenyl group and a tetracyclododecenyl group;
aryl groups such as a phenyl group, a tolyl group, a xylyl group, a mesityl group and a naphthyl group;
aralkyl groups such as a benzyl group, a phenethyl group, a phenylpropyl group and a naphthylmethyl group, and the like.

The monovalent oxyhydrocarbon group represented by the $R^{s1}$, $R^{s2}$ and $R^{s3}$ include alkoxy groups such as a methoxy group, an ethoxy group, a propoxy group and a butoxy group;

alkenyloxy groups such as an ethenyloxy group, a propenyloxy group and a butenyloxy group;

monovalent oxy chain-like hydrocarbon groups such as alkynyloxy groups such as an ethynyloxy group, a propynyloxy group and a butynyloxy group;

monocyclic cycloalkyloxy groups such as a cyclopropyloxy group, a cyclobutyloxy group, a cyclopentyloxy group and a cyclohexyloxy group;

monocyclic cycloalkenyloxy groups such as a cyclopropenyloxy group, a cyclobutenyloxy group and a cyclopentenyloxy group;

polycyclic cycloalkyloxy groups such as a norbornyloxy group, an adamantyloxy group, a tricyclodecanyloxy group and a tetracyclododecyloxy group;

monovalent oxy alicyclic hydrocarbon groups such as polycyclic cycloalkenyloxy groups such as a norbornenyloxy group, a tricyclodecenyloxy group and a tetracyclododecenyloxy group;

aryloxy groups such as a phenoxy group, a tolyloxy group, a xylyloxy group, a mesityloxy group and a naphthyloxy group;

aralkyloxy groups such as a benzyloxy group, a phenethyloxy group, a phenylpropyloxy group and a naphthylmethyloxy group, and the like.

The halogen atom represented by the $R^{s1}$, $R^{s2}$ and $R^{s3}$ is exemplified by a fluorine atom, a chlorine atom, a bromine atom and an iodine atom, and the like.

Among these, $R^{s1}$, $R^{s2}$ and $R^{s3}$ preferably represent a monovalent oxyhydrocarbon group, more preferably an alkyloxy group, and further preferably a methoxy group.

The structural unit (II) is exemplified by structural units represented by the following formulae, and the like.

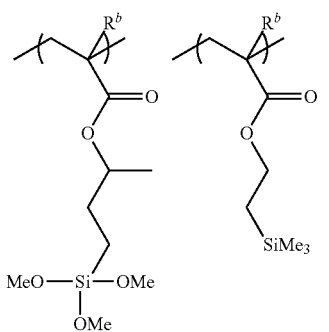

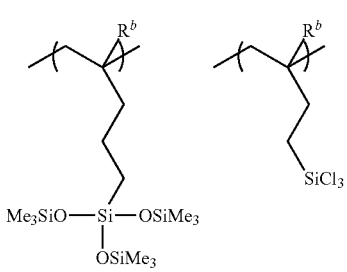

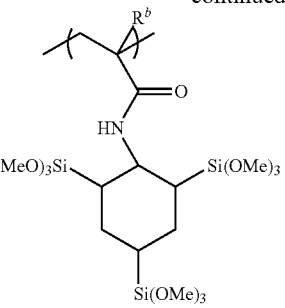

-continued

In the above formula, $R^b$ is as defined in the above formula (y).

Among these, a structural unit that includes a trimethoxysilyl group is preferred, a structural unit derived from 4-trimethoxysilyl-2-butyl (meth)acrylate and a structural unit derived from trimethoxysilyl cyclohexylacrylamide are more preferred, and a structural unit derived from 4-trimethoxysilyl-2-butyl (meth)acrylate is further preferred The vinyl polymer (b) may have other structural unit in addition to the structural unit (I) and the structural unit (II).

The proportion of the structural unit (I) contained is preferably 5 mol % to 80 mol %, more preferably 10 mol % to 70 mol %, and further preferably 20 mol % to 60 mol % based on all the structural units that configure the vinyl polymer (b). The proportion of the structural unit (II) contained is preferably 5 mol % to 80 mol %, more preferably 10 mol % to 70 mol %, and further preferably 20 mol % to 60 mol % based on all the structural units that configure the vinyl polymer (b).

Synthesis Method of Vinyl Polymer (b)

The vinyl polymer (b) can be synthesized by, for example, carrying out a polymerization reaction such as a radical polymerization using a monomer that gives the structural unit (I) and other monomer as needed. As the polymerization reaction method, well-known methods can be employed.

Polysiloxane (c)

The polysiloxane (c) is not particularly limited as long as it is a compound that includes a siloxane chain, and it may be the polysiloxane (a) described above that includes the specific group (a), or a polysiloxane that does not include the specific group (a) (identical to the polysiloxane (d) in the component (A1) described above). The polysiloxane (c) can be synthesized by, for example, hydrolytic condensation of the silane compound described above.

The silane compound that gives the polysiloxane (c) is preferably phenyltrialkoxysilane and tetraalkoxysilane, and more preferably phenyltrimethoxysilane and tetramethoxysilane.

The content of the vinyl polymer (b) in the component (A2) is preferably 1 part by mass to 80 parts by mass, more preferably 5 parts by mass to 70 parts by mass, and further preferably 10 parts by mass to 60 parts by mass based on 100 parts by mass of the polysiloxane (c).

Synthesis Method of Polysiloxane (c)

The polysiloxane (c) can be synthesized by, for example, hydrolytic condensation of the silane compound. As the hydrolytic condensation method, the method shown in the synthesis method of the polysiloxane (a) described above, and the like can be employed.

In addition, the polysiloxane (c) may be formed by carrying out a hydrolytic condensation of the silane compound described above in the presence of the vinyl polymer (b). Due to such a formation method of the polysiloxane (c), an affinity of the polysiloxane (c) to the vinyl polymer (b) can be enhanced. In the case in which the vinyl polymer (b) has a silicon atom-containing group (i.e. hydrolyzable silyl group), the vinyl polymer (b) and the polysiloxane (c) formed can bond via a siloxane bond to join, and as a result, a polysiloxane chain and the specific group (a) can be more firmly bonded. The mass ratio (vinyl polymer (b)/silane compound) of the vinyl polymer (b) to a silane compound charged upon synthesis of a polysiloxane that includes the vinyl polymer (b) is preferably 1/99 to 80/20, more preferably 5/95 to 70/30, and further preferably 10/90 to 40/60.

Nitrogen-Containing Compound (B)

The nitrogen-containing compound (B) is a compound that contains a nitrogen atom. The nitrogen-containing compound (B) is not particularly limited as long as it includes one or more nitrogen atom(s) in a molecule or an ion. The composition for forming a resist underlayer film can contain the nitrogen-containing compound (B). The nitrogen-containing compound (B) has an effect for improving properties such as an oxygen ashing resistance of the resist underlayer film obtained from the composition for forming a resist underlayer film. The effect is believed to be obtained due to the nitrogen-containing compound (B) present on the resist underlayer film a crosslinking reaction can be promoted in the underlayer film. In addition, the pattern collapse resistance of the resist pattern formed on the resist underlayer film obtained from the composition for forming a resist underlayer film can be improved.

The nitrogen-containing compound (B) is exemplified by an amine compound, an amide group-containing compound, a urea compound, a nitrogen-containing heterocyclic compound, and the like.

Examples of the amine compound include mono(cyclo)alkylamines; di(cyclo)alkylamines; tri(cyclo)alkylamines; substituted alkylaniline or a derivative thereof; ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis(1-(4-aminophenyl)-1-methylethyl)benzene, 1,3-bis(1-(4-aminophenyl)-1-methylethyl)benzene, bis(2-dimethylaminoethyl)ether, bis(2-diethylaminoethyl)ether, 1-(2-hydroxyethyl)-2-imidazolidinone, 2-quinoxalinol, N,N,N',N'-tetrakis(2-hydroxypropyl)ethylene diamine, N,N,N',N''N''-pentamethyldiethylenetriamine, and the like.

Examples of the amide group-containing compound include an N-t-butoxycarbonyl group-containing amino compound, an N-t-amyloxycarbonyl group-containing amino compound, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like. Among these, an N-t-butoxycarbonyl group-containing amino compound and an N-t-amyloxycarbonyl group-containing amino compound are preferred. Among these, N-t-butoxycarbonyl-4-hydroxypiperidine, N-t-amyloxycarbonyl-4-hydroxypiperidine, N-t-butoxycarbonyl pyrrolidine, N-t-butoxycarbonyl-2-hydroxymethyl pyrrolidine and an N-t-butoxycarbonyl-2-phenylbenzimidazole are preferred.

Examples of the urea compound include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compound include imidazoles; pyridines; piperazines; pyrazine, pyrazole, pyridazine, quinoxaline, purine, pyrrolidine, piperidine, piperidine ethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

Among these nitrogen-containing compounds (B), (B1) a nitrogen-containing compound having at least one polar group selected from a hydroxyl group and a carboxyl group, and an ester group (hereinafter, may be also referred to as "(B1) compound"), (B2) a nitrogen-containing compound having at least one group selected from a hydroxyl group, a carboxyl group and an ether group (hereinafter, may be also referred to as "(B2) compound"), and (B3) a nitrogen-containing compound having an ester group (hereinafter, may be referred to as "(B3) compound") are preferred. These are nitrogen-containing compounds having appropriate basic properties, and due to having a polar group and/or an ester group, a sublimation of the nitrogen-containing compound (B) upon baking in providing a resist underlayer film is suppressed, and thus the nitrogen-containing compound (B) remains in the resist underlayer film, whereby the effects described above can be sufficiently achieved.

The compound (B1) is exemplified by compounds represented by the following formulae (B-1-1) to (B-1-5), and the like.

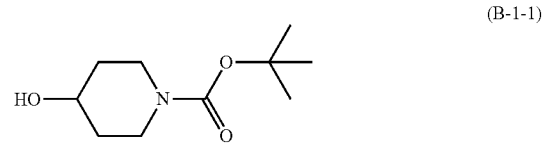

(B-1-1)

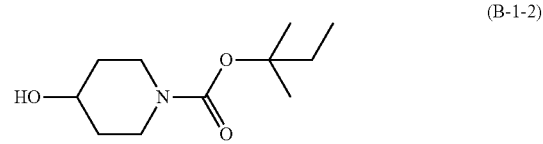

(B-1-2)

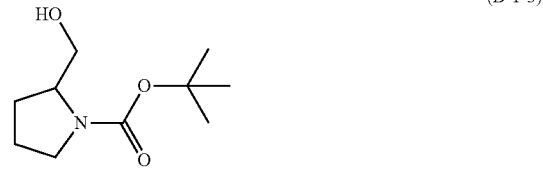

(B-1-3)

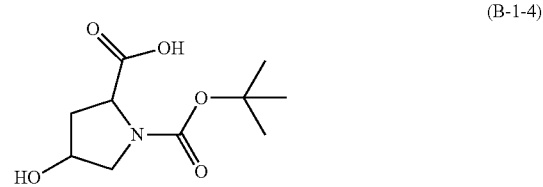

(B-1-4)

(B-1-5)

The compound (B2) is exemplified by compounds represented by the following formulae (B-2-1) to (B-2-4), and the like. In addition, the compound (B3) is exemplified by compounds represented by the following formulae (B-3-1) to (B-3-4), and the like.

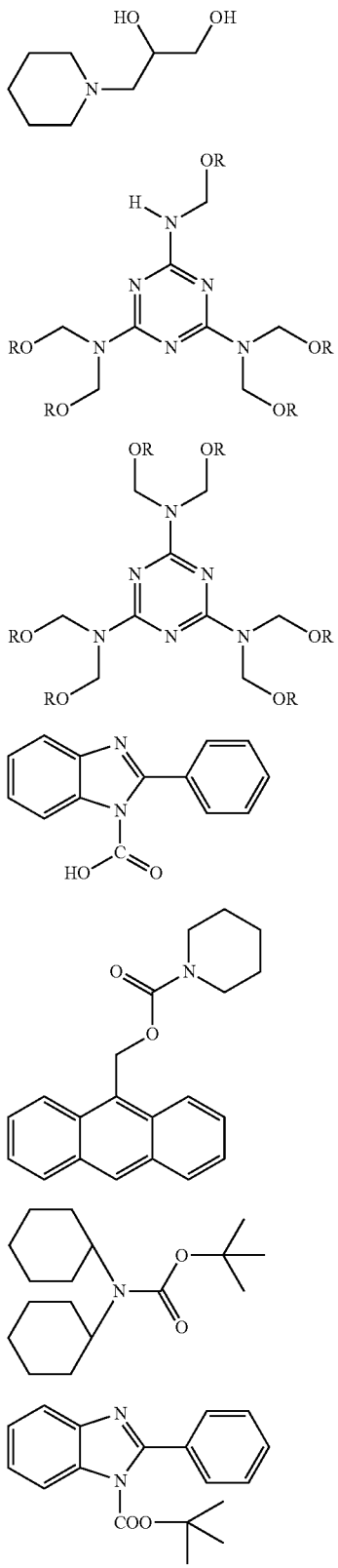

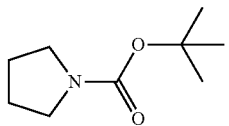

In the above formulae (B-2-2) and (B-2-3), R represents an alkyl group having 1 to 10 carbon atoms or a cycloalkyl group having 3 to 10 carbon atoms.

Among these, the nitrogen-containing compound (B) is preferably the compound (B1), and more preferably the compound represented by the above formula (B-1-1) and the compound represented by the above formula (B-1-2). Due to the nitrogen-containing compound (B) having both a polar group and an ester group, a sublimation of the nitrogen-containing compound (B) upon baking in providing a resist underlayer film is suppressed and the nitrogen-containing compound (B) remains in the resist underlayer film, whereby the effects described above can be sufficiently achieved.

The nitrogen-containing compound (B) may be used either one type alone, or two or more types in combination. The content of the nitrogen-containing compound (B) in the composition for forming a resist underlayer film is typically no greater than 30 parts by mass, preferably 0.1 parts by mass to 10 parts by mass, and more preferably 0.3 parts by mass to 6 parts by mass based on 100 parts by mass of the polysiloxane (A) in light of a more favorable resist pattern shape.

Acid Generating Agent (C)

(C) an acid generating agent is a compound that generates an acid by exposure. The composition for forming a resist underlayer film can contain the acid generating agent (C). In formation of a resist pattern by development with the organic solvent, due to the composition for forming a resist underlayer film containing the acid generating agent (C), the pattern collapse resistance of the resist pattern formed on the resist underlayer film is improved. It is believed that a dissociation reaction of an acid contained in a polymer of resist films at a light-exposed site is promoted by, for example, a catalytic action of an acid generated from the acid generating agent (C) by exposure, and thus more polar groups such as a carboxyl group are generated, whereby the polar groups strongly interact with a carboxyl group in a resist underlayer film formed from the composition for forming a resist underlayer film. In addition, in the case in which the component (A) has a group that can generate a carboxyl group by an action of an acid, due to the composition for forming a resist underlayer film containing the acid generating agent (C), generation of a carboxyl group can be promoted at a light-exposed site by a cleavage of the group that can generate a carboxyl group by an action of an acid.

Examples of the acid generating agent (C) include onium salt compounds such as sulfonium salt compounds, iodonium salt compounds and tetrahydrothiophenium salt compounds, and N-sulfonyloxyimide compounds, organic halogen compounds, sulfone compounds such as disulfones and diazomethanesulfones, and the like.

Examples of the sulfonium salt compound include: triphenylsulfonium salt compounds such as triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium 2-(3-tetracyclo[4.4.0.1$^{2,5}$.1$^{7,10}$]dodecanyl)-1,1-difluoroethanesulfonate, triphenylsulfonium N,N'-bis (nonafluoro-n-butanesulfonyl)imidate, triphenylsulfonium salicylate, triphenylsulfonium camphorsulfonate and triphenylsulfonium tricyclo[3.3.1.1$^{3,7}$]decanyldifluoromethanesulfonate; 4-cyclohexylphenyldiphenylsulfonium salt compounds such as 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium 2-(3-tetracyclo[4.4.0.1$^{2,5}$.1$^{7,10}$]dodecanyl)-1,1-difluoroethanesulfonate, 4-cyclohexylphenyldiphenylsulfonium N,N'-bis(nonafluoro-n-butanesulfonyl)imidate and 4-cyclohexylphenyldiphenylsulfonium camphorsulfonate; 4-t-butylphenyldiphenylsulfonium salt compounds such as 4-t-butylphenyldiphenylsulfonium trifluoromethanesulfonate, 4-t-butylphenyldiphenylsulfonium nonafluoro-n-butanesulfonate, 4-t-butylphenyldiphenylsulfonium perfluoro-n-octanesulfonate, 4-t-butylphenyldiphenylsulfonium 2-bicyclo[2.2.1]hept-2-yl-1,1,2,2-tetrafluoroethanesulfonate, 4-t-butylphenyldiphenylsulfonium 2-(3-tetracyclo[4.4.0.1$^{2,5}$.1$^{7,10}$]dodecanyl)-1,1-difluoroethanesulfonate, 4-t-butylphenyldiphenylsulfonium N,N'-bis(nonafluoro-n-butanesulfonyl)imidate and 4-t-butylphenyldiphenylsulfonium camphorsulfonate; tri(4-t-butylphenyl)sulfonium salt compounds such as tri(4-t-butylphenyl)sulfonium trifluoromethanesulfonate, tri(4-t-butylphenyl)sulfonium nonafluoro-n-butanesulfonate, tri(4-t-butylphenyl)sulfonium perfluoro-n-octanesulfonate, tri(4-t-butylphenyl)sulfonium 2-bicyclo[2.2.1]hept-2-yl-1,1,2,2-tetrafluoroethanesulfonate, tri(4-t-butylphenyl)sulfonium 2-(3-tetracyclo[4.4.0.1$^{2,5}$.1$^{7,10}$]dodecanyl)-1,1-difluoroethanesulfonate, tri(4-t-butylphenyl)sulfonium N,N'-bis(nonafluoro-n-butanesulfonyl)imidate and tri(4-t-butylphenyl)sulfonium camphorsulfonate, and the like.

Examples of the iodonium salt compound include: diphenyliodonium salt compounds such as diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium 2-(3-tetracyclo[4.4.0.1$^{2,5}$.1$^{7,10}$]dodecanyl)-1,1-difluoroethanesulfonate, diphenyliodonium N,N'-bis(nonafluoro-n-butanesulfonyl)imidate and diphenyliodonium camphorsulfonate; bis(4-t-butylphenyl)iodonium salt compounds such as bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium 2-(3-tetracyclo[4.4.0.1$^{2,5}$.1$^{7,10}$]dodecanyl)-1,1-difluoroethanesulfonate, bis(4-t-butylphenyl)iodonium N,N'-bis(nonafluoro-n-butanesulfonyl)imidate and bis(4-t-butylphenyl)iodonium camphorsulfonate, and the like.

Examples of the tetrahydrothiophenium salt compound include 1-(4-n-butoxynaphthalen-1-yl)tetrahydrothiophenium salt compounds such as 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium 2-(3-tetracyclo[4.4.0.1$^{2,5}$.1$^{7,10}$]dodecanyl)-1,1-difluoroethanesulfonate, 1-(4-n-butoxynaphthalen-1-yl)tetrahydrothiophenium N,N'-bis(nonafluoro-n-butanesulfonyl)imidate and 1-(4-n-butoxynaphthalen-1-yl)tetrahydrothiophenium camphorsulfonate; 1-(3,5-dimethyl-4-hydroxyphenyl)tetrahydrothiophenium salt compounds such as 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium 2-(3-tetracyclo[4.4.0.1$^{2,5}$.1$^{7,10}$]dodecanyl)-1,1-difluoroethanesulfonate, 1-(3,5-dimethyl-4-hydroxyphenyl)tetrahydrothiophenium N,N'-bis(nonafluoro-n-butanesulfonyl)imidate and 1-(3,5-dimethyl-4-hydroxyphenyl)tetrahydrothiophenium camphorsulfonate, and the like.

Examples of the N-sulfonyloxyimide compound include succinimide compounds such as N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hept-2-yl-1,1,2,2-tetrafluoroethanesulfonyloxy)succinimide, N-(2-(3-tetracyclo[4.4.0.1$^{2,5}$.1$^{7,10}$]dodecanyl)-1,1-difluoroethanesulfonyloxy)succinimide and N-(camphorsulfonyloxy)succinimide; bicyclo[2.2.1]hept-5-ene-2,3-dicarboxyimide compounds such as N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, N-(2-(3-tetracyclo[4.4.0.1$^{2,5}$.1$^{7,10}$]dodecanyl)-1,1-difluoroethanesulfonyloxy)bicyclo[2.2.1]hept-5-ene-2,3-dicarboxyimide and N-(camphorsulfonyloxy)bicyclo[2.2.1]hept-5-ene-2,3-dicarboxyimide, and the like.

Among these, the acid generating agent (C) is preferably an onium salt compound, more preferably a sulfonium salt compound, further preferably a triphenylsulfonium salt compound, and particularly preferably triphenylsulfonium trifluoromethanesulfonate. The acid generating agent (C) may be used either one type alone, or two or more types in combination.

The content of the acid generating agent (C) in the composition for forming a resist underlayer film is typically no greater than 20 parts by mass, preferably 0.01 parts by mass to 10 parts by mass, more preferably 0.05 parts by mass to 5 parts by mass, and further preferably 0.1 parts by mass to 3 parts by mass based on 100 parts by mass of the polysiloxane (A) in light of a more favorable resist pattern shape.

Solvent (D)

The composition for forming a resist underlayer film typically contains (D) a solvent. The solvent (D) can be used without particular limitations as long as it can dissolve or disperse the polysiloxane (A) and a component added as needed. The solvent (D) is exemplified by organic solvents such as an alcohol solvent, an ether solvent, a ketone organic solvent, an amide solvent, an ester organic solvent and a hydrocarbon solvent.

Examples of the alcohol solvent include:

monoalcohol solvents such as methanol, ethanol, n-propanol, iso-propanol, n-butanol, iso-butanol, sec-butanol, t-butanol, n-pentanol, iso-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethyl nonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether, and the like.

Examples of the ether solvent include dialiphatic ether solvents such as diethyl ether, ethylpropyl ether, dipropyl ether, dibutyl ether and diisopropyl ether;

aromatic ether-containing solvents such as anisole, phenylethyl ether, phenylpropyl ether, tolylmethyl ether, tolylethyl ether, diphenyl ether and ditolyl ether;

cyclic ether solvents such as tetrahydrofuran, tetrahydropyran and methyltetrahydrofuran, and the like.

Examples of the ketone solvent include linear ketone solvents such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-iso-butyl ketone and trimethyl nonanone;

cyclic ketone solvents such as cyclopentanone, cyclohexanone, cycloheptanone, cyclooctanone and methylcyclohexanone;

diketone solvents such as 2,4-pentanedione and acetonyl acetone;

hydroxyl group-containing ketone solvents such as diacetone alcohol;

aromatic ketone solvents such as acetophenone and phenylethyl ketone, and the like.

Examples of the amide solvent include N,N'-dimethylimidazolidinone, N-methylformamide, N,N-dimethylformamide, N,N-diethylformamide, acetamide, N-methylacetamide, N,N-dimethylacetamide, N-methylpropionamide, N-methylpyrrolidone, and the like.

Examples of the ester solvent include: carboxylate ester solvents such as methyl acetate, ethyl acetate, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, diglycol acetate, methoxytriglycol acetate, acetomethyl acetate, acetoethyl acetate, ethyl propionate, n-butyl propionate, iso-amyl propionate, diethyl oxalate, di-n-butyl oxalate, methyl lactate, ethyl lactate, n-butyl lactate, n-amyl lactate, diethyl malonate, dimethyl phthalate and diethyl phthalate;

polyhydric alcohol monoalkyl ether acetate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate and dipropylene glycol monoethyl ether acetate;

carbonate solvents such as diethyl carbonate and propylene carbonate;

lactone solvents such as γ-butyrolactone and γ-valerolactone, and the like.

Examples of the hydrocarbon solvents include:

aliphatic hydrocarbon solvents such as n-pentane, iso-pentane, n-hexane, iso-hexane, n-heptane, iso-heptane, 2,2,4-trimethyl pentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene and n-amylnaphthalene;

halogen-containing solvents such as dichloromethane, chloroform, chlorofluorocarbon, chlorobenzene and dichlorobenzene, and the like.

Among these, the solvent (D) is preferably an alcohol solvent and an ester solvent, more preferably a polyhydric alcohol partial ether solvent and a polyhydric alcohol monoalkyl ether acetate solvent and further preferably propylene glycol monoethyl ether and propylene glycol monomethyl ether acetate. The solvent (D) may be used either one type alone, or two or more types in combination.

The composition for forming a resist underlayer film may contain water. Due to containing the water, the polysiloxane (A) is hydrated, thereby resulting in an improvement of storage stability. In addition, due to containing the water, curing of the resist underlayer film upon film formation is promoted, whereby a minute film can be obtained. The proportion of the water contained in the composition for forming a resist underlayer film is preferably 0% by mass to 30% by mass, more preferably 0.1% by mass to 20% by mass, and further preferably 0.2% by mass to 15% by mass. When the proportion of the water in the composition for forming a resist underlayer film contained exceeds the upper limit, the storage stability of the composition for forming a resist underlayer film may be deteriorated, and further uniformity of a coating film may be deteriorated.

Other Component

The composition for forming a resist underlayer film may further contain β-diketone, colloidal silica, colloidal alumina, an organic polymer, a surfactant, a base generator, and the like as other component.

Preparation Method of a Composition for Forming a Resist Underlayer Film

The composition for forming a resist underlayer film is obtained by, for example, mixing the polysiloxane (A), the nitrogen-containing compound (B) as needed, the acid generating agent (C) and other component, and dissolving or dispersing them in the solvent (D). The solid content concentration of the composition for forming a resist underlayer film is preferably 0.5% by mass to 20% by mass, and more preferably 1% by mass to 10% by mass.

The composition for forming a resist underlayer film of the present invention contains
(A') a polysiloxane having an acid anhydride group.

The composition for forming a resist underlayer film contains the polysiloxane (A') as a polysiloxane component. The polysiloxane (A') is a polysiloxane having an acid anhydride group. Thus, according to this composition for forming a resist underlayer film, the polysiloxane (A) in the composition for forming a resist underlayer film used for the resist pattern-forming method is replaced with the polysiloxane (A'). The composition for forming a resist underlayer film has an advantage that it is excellent in adhesiveness to a resist film to a hydrophilic group such as a carboxyl group since it contains a polysiloxane having an acid anhydride group. The tendency is found not only in development with the organic solvent, but also particularly in development with the alkali, and thus the minimum pre-collapse dimension can be comparatively small. It is believed that polymers that configure a resist pattern contain a lot of ester groups, for example, in development with the alkali, the groups and an acid anhydride group have an appropriate interaction, and the like. In addition, due to the composition for forming a resist underlayer film further containing the nitrogen-containing compound (B) and/or the acid generating agent (C), the pattern collapse resistance can be further improved particularly in development with the alkali.

The polysiloxane (A') is preferably a hydrolytic condensation product of a compound that includes the silane compound represented by the above formula (1a).

In the above formula (1a), $R^{1a}$ represents a monovalent organic group that includes an acid anhydride group; $R^2$ represents a hydrogen atom, a fluorine atom, a cyano group, an alkyl group having 1 to 5 carbon atoms, a cyanoalkyl group, an alkenyl group or an aryl group; X represents a halogen atom or $-OR^3$, wherein $R^3$ represents a monovalent organic group; a is an integer of 1 to 3; and b is an integer of 0 to 2, wherein an inequality of $1 \leq (a+b) \leq 3$ is satisfied.

With respect to the silane compound represented by the above formula (1a), the description in the case in which $R^1$ represents a monovalent organic group that includes an acid anhydride group in the silane compound (1) can be adopted.

Description with respect to the composition for forming a resist underlayer film is omitted here since matters other than those described above are described in the section of the composition for forming a resist underlayer film used for the aforementioned resist pattern-forming method.

EXAMPLES

Hereinafter, the present invention will be specifically explained by way of Examples, and the present invention is not limited thereto. Measuring methods of various types of physical property values are shown below.
Solid Content Concentration in a Solution that Includes a Polysiloxane The solid content concentration (% by mass) in a solution that includes a polysiloxane was obtained by baking 0.5 g of the solution that includes a polysiloxane at 250° C. for 30 minutes and determining the masses of the remaining substances.
Synthesis of Polysiloxane (a)

Silane compounds used for a synthesis of the polysiloxane (a) are shown below.
Structural formulae of each compound are shown below.
Compound (M-1): tetramethoxysilane
Compound (M-2): methyltrimethoxysilane
Compound (M-3): phenyltrimethoxysilane
Compound (M-4): 4-tolyltrimethoxysilane
Compound (M-5): trimethoxypropylsuccinicanhydridesilane
Compound (M-6): trimethoxypropylsuccinicsilane
Compound (M-7): trimethoxy(2-(1-isopropyl-1-cyclopropyloxycarbonyl)propylsulfanilpropyl)silane

(M-1)

(M-2)

(M-3)

(M-4)

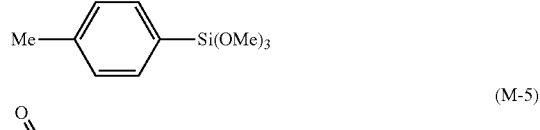
(M-5)

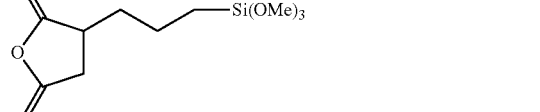
(M-6)

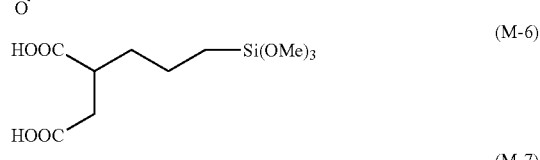
(M-7)

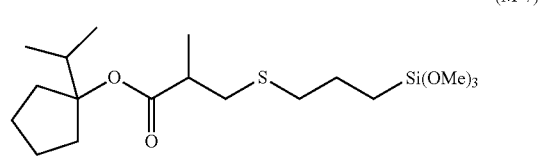

Synthesis Example 1

Synthesis of Polysiloxane (a-1)

Oxalic acid in an amount of 1.14 g was dissolved in 11.29 g of water with heating to prepare an aqueous oxalic acid solution. A flask charged with 21.09 g of the compound (M-1), 3.23 g of the compound (M-3), 2.14 g of the compound (M-5) and 61.12 g of propylene glycol monoethyl ether was fitted with a condenser and a dropping funnel containing the prepared aqueous oxalic acid solution. Next, after heating the mixture to 60° C. in an oil bath, the aqueous oxalic acid solution was slowly added dropwise to the mixture, and the mixture was reacted at 60° C. for 4 hours. After completion of the reaction, the flask containing the reaction solution was allowed to cool, and then methanol generated during the reaction was removed using an evaporator to obtain a solution that includes 97.3 g of (a-1) a polysiloxane. The Mw of the polysiloxane (a-1) was 1,600. In addition, the solid content concentration of the solution containing the polysiloxane (a-1) was 16% by mass.

Synthesis Examples 2 to 6

Synthesis of Polysiloxanes (a-2) to (a-6)

Polysiloxanes (a-2) to (a-6) were synthesized in a similar manner to Synthesis Example 1 except that monomers having types and amounts used shown in Table 1 below were used. It is to be noted that the total mass of monomers used was 30 g.

Synthesis Example 7

Synthesis of Polysiloxane (d-1)

(d-1) a polysiloxane was synthesized in a similar manner to Synthesis Example 1 except that monomers having types and amounts used shown in Table 1 below were used. It is to be noted that the total mass of monomers used was 30 g.

The Mw of the each polysiloxane synthesized and the solid content concentration of solutions that includes the each polysiloxane are together shown in Table 1.

TABLE 1

| | Polysiloxane | Monomer Type | Amount used (mol %) | Mw | Solid content concentration (% by mass) |
|---|---|---|---|---|---|
| Synthesis Example 1 | a-1 | M-1 | 85 | 1,600 | 16 |
| | | M-3 | 10 | | |
| | | M-5 | 5 | | |
| Synthesis Example 2 | a-2 | M-1 | 80 | 1,600 | 16 |
| | | M-3 | 10 | | |
| | | M-5 | 10 | | |
| Synthesis Example 3 | a-3 | M-1 | 80 | 1,600 | 16 |
| | | M-2 | 10 | | |
| | | M-4 | 5 | | |
| | | M-5 | 5 | | |
| Synthesis Example 4 | a-4 | M-1 | 85 | 1,600 | 16 |
| | | M-3 | 10 | | |
| | | M-6 | 5 | | |
| Synthesis Example 5 | a-5 | M-1 | 80 | 1,600 | 16 |
| | | M-3 | 10 | | |
| | | M-6 | 10 | | |
| Synthesis Example 6 | a-6 | M-1 | 85 | 1,600 | 16 |
| | | M-3 | 10 | | |
| | | M-7 | 5 | | |
| Synthesis Example 7 | d-1 | M-1 | 90 | 1,600 | 16 |
| | | M-3 | 10 | | |

Synthesis of Vinyl Polymer (b)

Monomers used for the synthesis of the vinyl polymer (b) are shown below.

S-1: 1-i-propyl-1-cyclopentyl methacrylate (a compound represented by the following formula (S-1))
S-2: 3-methacryloxypropyltrimethoxysilane (a compound represented by the following formula (S-2))

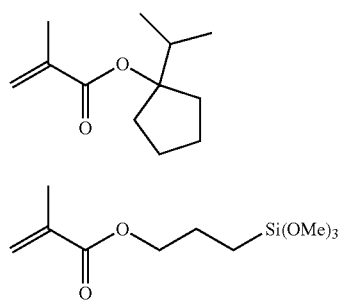

It is to be noted that the compound (S-1) and the compound (S-2) give the structural unit (I) and the structural unit (II), respectively.

Synthesis Example 8

Synthesis of Vinyl Polymer (b-1)

A solution was prepared which was obtained by dissolving 44.15 g (46.5 mol %) of the compound (S-1) represented by the above formula, 55.85 g (53.5 mol %) of the compound (S-2) and 3.69 g of dimethyl 2,2'-azobis(2-isobutyronitrile) (polymerization initiator) in 200 g of 2-butanone. The respective molar ratios of the compounds were represented as mol % based on the total number of moles of the compounds. A 1,000 mL three-necked flask was charged with 100 g of 2-butanone and the mixture was purged with nitrogen for 30 minutes, followed by heating the reaction vessel at 80° C. with stirring. The prepared solution was added dropwise over 3 hours to the mixture, and further after completion of the adding dropwise, the mixture was aged at 80° C. for 3 hours. After completion of the polymerization, the polymerization reaction liquid was cooled to no greater than 30° C. by water cooling. The polymerization reaction liquid was concentrated in vacuo using an evaporator until the mass reached 130 g. Next, the concentrated polymerization reaction liquid was charged with 670 g of acetonitrile and 270 g ethyl acetate, and the polymerization reaction liquid in the reaction vessel was stirred for 10 minutes. The polymerization reaction liquid was charged with 1,350 g of hexane and was stirred for 30 minutes. The stirring was stopped and the reaction vessel was allowed to stand still for 30 minutes, and separated underlayer part was recovered. The reaction vessel was charged with the underlayer part, further charged with 1,350 g of hexane, and the mixture was stirred for 30 minutes. The stirring was stopped and the mixture was allowed to stand still for 30 minutes, and the separated underlayer part was recovered. A similar operation was repeated again. The obtained underlayer part was charged with 1,070 g of propylene glycol monoethyl ether, followed by removing hexane, acetonitrile, ethyl acetate and 2-butanone contained in the mixture using an evaporator to obtain a 530 g of solution that includes (b-1) a vinyl polymer. The solid content concentration of the solution that includes the vinyl polymer (b-1) was 11.7% by mass (yield: 66%). The Mw of the obtained polymer was 6,440 and the Mw/Mn of the obtained polymer was 1.77.

Synthesis of Polysiloxane that Includes Vinyl Polymer (B)

Synthesis Example 9

Synthesis of Polysiloxane that Includes Vinyl Polymer (bc-1)

10.40 g of maleic acid was dissolved in 12.28 g of water with heating to prepare an aqueous maleic acid solution. A flask charged with 8.33 g of the synthesized vinyl polymer (b-1), 39.88 g (90 mol %) of the compound (M-1), 5.77 g (90 mol %) of the compound (M-3) and 74.33 g of propylene glycol monoethyl ether was fitted with a condenser and a dropping funnel containing the prepared aqueous maleic acid solution. The respective molar ratios of the compounds were represented as mol % based on the total number of moles of the compounds. The charged ratio of the vinyl polymer (b-1) to a silane compound monomer was 15:85 (mass ratio). Next, after heating the flask at 60° C. using an oil bath, the aqueous maleic acid solution was slowly added dropwise and reacted at 60° C. for 4 hours. After completion of the reaction, the flask containing the reaction solution was allowed to cool, and then methanol generated by the reaction was removed using an evaporator to obtain a 100 g of solution that includes (bc-1) a polysiloxane that includes a vinyl polymer. The Mw of the polysiloxane (bc-1) that includes a vinyl polymer was 3,600. In addition, the solid content concentration of the solution that includes the polysiloxane (bc-1) that includes a vinyl polymer was 20% by mass.

Preparation of Photoresist Composition

Synthesis of Base Polymer

Synthesis Example 10

A solution was prepared which was obtained by dissolving 11.92 g of (Q-1) a compound, 41.07 g of (Q-2) a compound, 15.75 g of (Q-3) a compound, 11.16 g of (Q-4) a compound and 20.10 g of (Q-5) a compound represented by the following formulae, and 3.88 g of dimethyl 2,2'-azobis(2-isobutyronitrile) (polymerization initiator) in 200 g of 2-butanone. A 1,000 mL three-necked flask was charged with 100 g of 2-butanone and the mixture was purged with nitrogen for 30 minutes, followed by heating the reaction vessel at 80° C. with stirring. The prepared solution was added dropwise over 4 hours to the mixture, and further after completion of the dropping, the mixture was aged at 80° C. for 2 hours. After completion of the polymerization, the polymerization reaction liquid was cooled to no greater than 30° C. by water cooling. The polymerization reaction liquid was concentrated in vacuo using an evaporator until the mass reached 200 g. Thereafter, the concentrated polymerization reaction liquid was charged into 1,000 g of methanol and reprecipitation operation was performed. The deposited slurry was filtered off by vacuum filtration, and the solid content was washed with methanol three times. The obtained powder was dried in vacuo at 60° C. for 15 hours to obtain 88.0 g (yield: 88%) of (G) a polymer (base polymer) which was a white powder. The Mw of the obtained polymer (G) was 9,300 and the Mw/Mn of the obtained polymer (G) was 1.60. As a result of $^{13}$C-NMR analysis, the proportion of structural units derived from the compounds (Q-1), (Q-2), (Q-3), (Q-4) and (Q-5) contained were 16 mol %, 26 mol %, 19 mol %, 11 mol % and 28 mol %, respectively. It is to be noted that the $^{13}$C-NMR analysis was carried out using a nuclear magnetic resonance apparatus (JNM-ECP500, manufactured by JEOL, Ltd.).

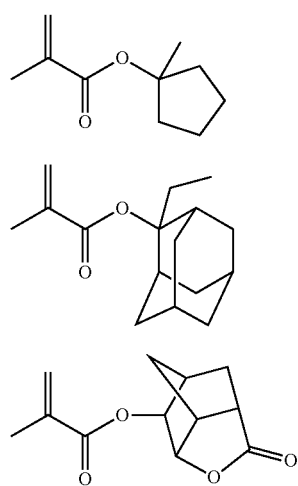

(Q-1)

(Q-2)

(Q-3)

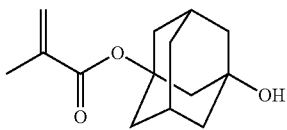

(Q-4)

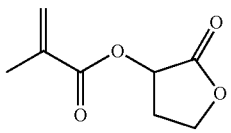

(Q-5)

Synthesis of Fluorine-Containing Polymer

Synthesis Example 11

A 100 mL three-necked flask was charged with a solution prepared by dissolving 3.8 g of (Q-6) a compound and 1.2 g of (Q-7) a compound represented by the following formulae into 10 g of 2-butanone and further dissolving 0.09 g of 2,2'-azobis(2-isobutyronitrile). The mixture was purged with nitrogen for 30 minutes and thereafter the reaction vessel was heated at 80° C. with stirring. The time when heating was started was assumed to be a start time point of polymerization and the polymerization reaction was carried out for 6 hours. After completion of the polymerization, the polymerization reaction liquid was cooled to no greater than 30° C. by water cooling and the polymerization reaction liquid was concentrated in vacuo by an evaporator until the mass reached 12.5 g. The concentrated polymerization reaction liquid was slowly charged into 75 g of n-hexane cooled to 0° C. to allow the solid content to be deposited. The liquid was filtered, the solid content was washed with n-hexane and the obtained powder was dried in vacuo at 40° C. for 15 hours to obtain 3.75 g (yield: 75%) of (F) a polymer (fluorine-containing polymer) which was a white powder. The Mw of the polymer (F) was 9,400 and the Mw/Mn of the polymer (F) was 1.50. As a result of $^{13}$C-NMR analysis, the proportions of structural units derived from the compounds (Q-6) and (Q-7) contained were 68.5 mol % and 31.5 mol %, respectively, and the percentage of a fluorine atom contained was 21.4% by mass.

(Q-6)

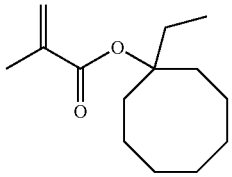

(Q-7)

Preparation of Photoresist Composition

Synthesis Example 12

100 parts by mass of the polymer (G) that serves as a base polymer and that was obtained in the Synthesis Example 7, 5 parts by mass of the polymer (F) that serves as a fluorine-containing polymer and that was obtained in the Synthesis Example 8, 10 parts by mass of the following compound (C-1) that serves as an acid generating agent and 0.6 parts by mass of the following compound (B-1) that serves as an acid diffusion control agent were added to 1,881 parts by mass of propylene glycol monomethyl ether acetate that serves as a solvent, 806 parts by mass of cyclohexanone and 200 parts by mass of γ-butyrolactone to prepare a solution. The solution was filtered through a membrane filter having a pore size of 0.1 μm to prepare a photoresist composition.

Preparation of a Composition for Forming a Resist Underlayer Film

The nitrogen-containing compound (B), the acid generating agent (C) and the solvent (D) used for preparation of the composition for forming a resist underlayer film are shown below.

Nitrogen-Containing Compound (B)
B-1: N-t-amyloxycarbonyl-4-hydroxypiperidine
Acid Generating Agent (C)
C-1: triphenylsulfonium trifluoromethanesulfonate
Solvent (D)
D-1: propylene glycol monomethyl ether acetate
D-2: propylene glycol monoethyl ether Preparation of a Composition for Forming a Resist Underlayer Film that Contains Component (A1)

Example 1

Preparation of a Composition for Forming a Resist Underlayer Film (J-1)

The solution that includes 1.80 parts by mass of the polysiloxane (a-1) as the polysiloxane (a) and that was obtained in the Synthesis Example 1 and 68.74 parts by mass of the (D-1) and 29.46 parts by mass of the (D-2) as the solvent (D) were mixed. Thereafter, the solution was filtered through a filter having a pore size of 0.2 μm to obtain a composition for forming (J-1) a resist underlayer film.

Examples 2 to 9, Synthesis Examples 13 to 21 and Comparative Synthesis Examples 1 to 3

Preparation of Compositions for Forming a Resist Underlayer Film (J-2) to (J-18) and (CJ-1) to (CJ-3)

Compositions for forming a resist underlayer film (J-2) to (J-21) and (CJ-1) to (CJ-3) were obtained in a similar manner to Example 1 except that each component having types and amounts blended as shown in Table 2 below was used. It is to be noted that "-" in the Table 2 denotes that the corresponding component was not used.

Preparation of a Composition for Forming a Resist Underlayer Film that Contains Component (A2)

Synthesis Example 22

Preparation of a Composition for Forming a Resist Underlayer Film (J-19)

The solution that includes 1.80 parts by mass of the polysiloxane (bc-1) as the polysiloxane that includes the vinyl polymer (b) obtained in Synthesis Example 9 and 68.74 parts by mass of the (D-1) and 29.46 parts by mass of the (D-2) as the solvent (D) were mixed. Thereafter, the solution was filtered through a filter having a pore size of 0.2 μm to obtain (J-19) a composition for forming a resist underlayer film.

Synthesis Examples 23 and 24

Preparation of Compositions for Forming a Resist Underlayer Film (J-20) and (J-21)

Compositions for forming a resist underlayer film (J-20) and (J-21) were obtained in a similar manner to Synthesis Example 22 except that each component having types and amounts blended as shown in Table 2 below was used. It is to be noted that "-" in the Table 2 denotes that the corresponding component was not used.

TABLE 2

| | Composition for forming resist underlayer film | Polysiloxane that includes a polysiloxane or vinyl polymer | | (B) Nitrogen-containing compound | | (C) Acid generating agent | | (D) Solvent | |
|---|---|---|---|---|---|---|---|---|---|
| | | Type | Amount blended (parts by mass) | Type | Amount blended (parts by mass) | Type | Amount blended (parts by mass) | Type | Amount blended (parts by mass) |
| Example 1 | J-1 | a-1 | 1.80 | — | — | — | — | D-1/D-2 | 68.74/29.46 |
| Example 2 | J-2 | a-1 | 1.75 | B-1 | 0.05 | — | — | D-1/D-2 | 68.74/29.46 |
| Example 3 | J-3 | a-1 | 1.77 | B-1 | 0.02 | C-1 | 0.01 | D-1/D-2 | 68.74/29.46 |
| Example 4 | J-4 | a-2 | 1.80 | — | — | — | — | D-1/D-2 | 68.74/29.46 |
| Example 5 | J-5 | a-2 | 1.75 | B-1 | 0.05 | — | — | D-1/D-2 | 68.74/29.46 |
| Example 6 | J-6 | a-2 | 1.77 | B-1 | 0.02 | C-1 | 0.01 | D-1/D-2 | 68.74/29.46 |
| Example 7 | J-7 | a-3 | 1.80 | — | — | — | — | D-1/D-2 | 68.74/29.46 |
| Example 8 | J-8 | a-3 | 1.75 | B-1 | 0.05 | — | — | D-1/D-2 | 68.74/29.46 |
| Example 9 | J-9 | a-3 | 1.77 | B-1 | 0.02 | C-1 | 0.01 | D-1/D-2 | 68.74/29.46 |
| Synthesis Example 13 | J-10 | a-4 | 1.80 | — | — | — | — | D-1/D-2 | 68.74/29.46 |
| Synthesis Example 14 | J-11 | a-4 | 1.75 | B-1 | 0.05 | — | — | D-1/D-2 | 68.74/29.46 |
| Synthesis | J-12 | a-4 | 1.77 | B-1 | 0.02 | C-1 | 0.01 | D-1/D-2 | 68.74/29.46 |

TABLE 2-continued

| Composition for forming resist underlayer film | Polysiloxane that includes a polysiloxane or vinyl polymer | | (B) Nitrogen-containing compound | | (C) Acid generating agent | | (D) Solvent | |
|---|---|---|---|---|---|---|---|---|
| | Type | Amount blended (parts by mass) | Type | Amount blended (parts by mass) | Type | Amount blended (parts by mass) | Type | Amount blended (parts by mass) |
| Example 15 Synthesis Example 16 | J-13 | a-5 | 1.80 | — | — | — | — | D-1/D-2 | 68.74/29.46 |
| Synthesis Example 17 | J-14 | a-5 | 1.75 | B-1 | 0.05 | — | — | D-1/D-2 | 68.74/29.46 |
| Synthesis Example 18 | J-15 | a-5 | 1.77 | B-1 | 0.02 | C-1 | 0.01 | D-1/D-2 | 68.74/29.46 |
| Synthesis Example 19 | J-16 | a-6 | 1.80 | — | — | — | — | D-1/D-2 | 68.74/29.46 |
| Synthesis Example 20 | J-17 | a-6 | 1.75 | B-1 | 0.05 | — | — | D-1/D-2 | 68.74/29.46 |
| Synthesis Example 21 | J-18 | a-6 | 1.77 | B-1 | 0.02 | C-1 | 0.01 | D-1/D-2 | 68.74/29.46 |
| Synthesis Example 22 | J-19 | bc-1 | 1.80 | — | — | — | — | D-1/D-2 | 68.74/29.46 |
| Synthesis Example 23 | J-20 | bc-1 | 1.75 | B-1 | 0.05 | — | — | D-1/D-2 | 68.74/29.46 |
| Synthesis Example 24 | J-21 | bc-1 | 1.77 | B-1 | 0.02 | C-1 | 0.01 | D-1/D-2 | 68.74/29.46 |
| Comparative synthesis Example 1 | CJ-1 | d-1 | 1.80 | — | — | — | — | D-1/D-2 | 68.74/29.46 |
| Comparative synthesis Example 2 | CJ-2 | d-1 | 1.75 | B-1 | 0.05 | — | — | D-1/D-2 | 68.74/29.46 |
| Comparative synthesis Example 3 | CJ-3 | d-1 | 1.77 | B-1 | 0.02 | C-1 | 0.01 | D-1/D-2 | 68.74/29.46 |

Formation of Resist Underlayer Film

The compositions for forming a resist underlayer film prepared in the Examples and Comparative Examples were coated on a silicon wafer by a spin coating method and PB was carried out on a hot plate at 220° C. for 1 minute to provide each resist underlayer film. The film thickness of the each obtained resist underlayer films measured by a film thickness measuring device (M-2000D; manufactured by J. A. Woollam) was 30 nm.

Evaluations

With respect to the resist underlayer films provided, a substrate reflectance and an oxygen ashing resistance were evaluated. In addition, resist patterns were provided on the resist underlayer films, and lithography performances such as pattern collapse resistance and a resist pattern shape were evaluated. The results of the evaluations are shown in Table 3.

Substrate Reflectance

The refractive index parameter (n) and the extinction coefficient (k) of the resist underlayer film provided, a resist underlayer film formed from other composition for forming a resist underlayer film ("NFC HM8006" manufactured by JSR Corporation), and a resist film formed from the photoresist composition obtained in the Synthesis Example 9 were measured using a high-speed spectroscopic ellipsometer ("M-2000" manufactured by J. A. Woollam). The substrate reflectance under a condition involving NA of 1.3 and Dipole, of a film obtained by laminating the resist film, each composition for forming a resist underlayer film and other resist underlayer film was determined from the measured values using a simulation software ("Prolith" manufactured by KLA-Tencor). The evaluation was made as: "A" (favorable) in the case in which the substrate reflectance was no greater than 1%; and "B" (unfavorable) in the case in which the substrate reflectance was greater than 1%.

Oxygen-Ashing Resistance

The resist underlayer film provided was subjected to an $O_2$ treatment at 100 W for 120 seconds using an ashing system ("NA1300" manufactured by ULVAC). The difference between the film thickness of the resist underlayer film before the $O_2$ treatment and the film thickness of the resist underlayer film after the $O_2$ treatment was determined. The numerical values of the difference between the film thicknesses of the resist underlayer film before and after the $O_2$ treatment are shown in Table 3. The evaluation of the oxygen-ashing resistance may be made as: "A" (favorable) in the case in which the difference of the film thicknesses was less than 5 nm; "B" (somewhat favorable) in the case in which the difference was 5 nm or greater and 8 nm or less; and "C" (unfavorable) in the case in which the difference was greater than 8 nm.

Lithography Performances

Pattern Collapse Resistance and Resist Pattern Shape

Examples 10 to 30 and Comparative Examples 1 to 3

Resist patterns were formed according to the following methods and the lithography performances of the obtained resist patterns were evaluated. The evaluations were carried out not only in the case of development with the organic solvent but also in the case of development with the alkali.
Development with the Organic Solvent A composition for forming an underlayer antireflective film ("HM8006" manufactured by JSR Corporation) was spin-coated onto a 12-inch silicon wafer, and prebaked (PB) at 250° C. for 60 seconds to obtain an underlayer antireflective film having a thickness of 100 nm. The composition for forming a resist underlayer film prepared in the Examples and the Comparative Examples was spin-coated onto the underlayer antireflective film, prebaked (PB) at 220° C. for 60 seconds, and cooled at 23° C. for 60 seconds to provide a resist underlayer film having a thickness of 30 nm. Next, the photoresist composition obtained in the Synthesis Examples 9 was spin-coated onto the resist underlayer film, prebaked (PB) at 100° C. for 60 seconds, and cooled at 23° C. for 30 seconds to provide a resist film having a thickness of 100 nm.

Subsequently, exposure was carried out through a mask for formation of 42 nm line/84 nm pitch using an ArF Immersion Scanner ("S610C", manufactured by NIKON) under an optical condition of dipole with NA of 1.30. Post exposure baking (PEB) was carried out on a hot plate of the aforementioned coater/developer at 100° C. for 60 seconds, followed by cooling at 23° C. for 30 seconds. Thereafter, puddle development was carried out for 30 seconds with an LD nozzle of a cup for development with butyl acetate as a developer, followed by rinsing with methylisobutylcarbinol as a rinse liquid. Thereafter, a resist pattern of 42 nm line/84 nm pitch was formed by spin-drying through swinging off at 2,000 rpm for 15 seconds. It is to be noted that the resist pattern was measured and observed using a scanning electron microscope ("CG-4000" manufactured by Hitachi High-Technologies Corporation).

In the formation of the resist pattern, an exposure dose at which a 42 nm line/84 nm pitch (line and space (1L/1S) pattern) was formed was defined as an optimum exposure dose. The exposure was performed while increasing the exposure dose stepwise from the optimum exposure dose. In this case, since the line width of the pattern gradually decreases, the resist pattern collapse is observed when the resist pattern has a line width corresponding to a given exposure dose. Accordingly, a line width corresponding to the maximum exposure dose at which the resist pattern did not collapse was defined as the minimum pre-collapse dimension (nm), and used as an index of the pattern collapse resistance. The values of the minimum pre-collapse dimension are shown in Table 3. The pattern collapse resistance may be evaluated as "favorable" in the case in which the minimum pre-collapse dimension was no greater than 40 nm, and "unfavorable" in the case in which the minimum pre-collapse dimension exceeds 40 nm. In addition, the resist pattern shapes were observed using the scanning electron microscope. The resist pattern was evaluated as "A" (favorable) in the case in which tailing was not found at the bottom of the resist pattern, and "B" (unfavorable) in the case in which the tailing was found.
Development with Alkali Resist patterns were formed and pattern collapse resistances thereof and resist pattern shapes were evaluated in a similar manner to the case of development with the organic solvent except that a 2.38% by mass aqueous tetramethylammoniumhydroxide solution was used as a developer solution and that ultra pure water was used as a rinse agent.

TABLE 3

| | | | | Evaluations | | | |
|---|---|---|---|---|---|---|---|
| | | | | Lithography performances | | | |
| | | | | Development with organic solvent | | Development with alkali | |
| | Composition for forming resist underlayer film | Substrate reflectance | Oxygen ashing resistance | Minimum pre-collapse dimension (nm) | Pattern shape | Minimum pre-collapse dimension (nm) | Pattern shape |
| Example 10 | J-1 | A | 5 | 33 | A | 38 | A |
| Example 11 | J-2 | A | 3 | 36 | A | 35 | A |
| Example 12 | J-3 | A | 3 | 36 | A | 36 | A |
| Example 13 | J-4 | A | 5 | 33 | A | 38 | A |
| Example 14 | J-5 | A | 3 | 36 | A | 35 | A |
| Example 15 | J-6 | A | 3 | 36 | A | 36 | A |
| Example 16 | J-7 | A | 5 | 33 | A | 38 | A |
| Example 17 | J-8 | A | 3 | 36 | A | 35 | A |
| Example 18 | J-9 | A | 3 | 36 | A | 36 | A |
| Example 19 | J-10 | A | 5 | 33 | A | 39 | A |
| Example 20 | J-11 | A | 3 | 35 | A | 37 | A |
| Example 21 | J-12 | A | 3 | 34 | A | 37 | A |
| Example 22 | J-13 | A | 5 | 33 | A | 39 | A |
| Example 23 | J-14 | A | 3 | 35 | A | 37 | A |
| Example 24 | J-15 | A | 3 | 34 | A | 37 | A |
| Example 25 | J-16 | A | 5 | 33 | A | 38 | A |
| Example 26 | J-17 | A | 3 | 35 | A | 37 | A |
| Example 27 | J-18 | A | 3 | 34 | A | 37 | A |
| Example 28 | J-19 | A | 5 | 33 | A | 39 | A |
| Example 29 | J-20 | A | 3 | 35 | A | 37 | A |
| Example 30 | J-21 | A | 3 | 34 | A | 37 | A |
| Comparative Example 1 | CJ-1 | A | 5 | 34 | A | 40 | A |
| Comparative Example 2 | CJ-2 | A | 3 | 36 | A | 37 | A |
| Comparative Example 3 | CJ-3 | A | 3 | 36 | A | 38 | A |

The results shown in Table 3 revealed that according to the resist pattern-forming method and the composition for forming a resist underlayer film of the embodiments of the present invention, a resist pattern excellent in pattern collapse resistance can be formed while a favorable pattern shape is maintained in the case of development with a organic solvent. In addition, the results shown in Table 3 revealed that according to the resist pattern-forming method and the composition for forming a resist underlayer film of the embodiments of the present invention, the effects described above were obtained not only in the case of development with the organic solvent but also in the case of development with an alkali. Furthermore, the results shown in Table 3 revealed that due to the composition for forming a resist underlayer film of the present invention further containing the nitrogen-containing compound (B) and/or the acid generating agent (C) the pattern collapse resistance can be further improved particularly in the case of development with the alkali.

INDUSTRIAL APPLICABILITY

The present invention provides a resist pattern-forming method and a composition for forming a resist underlayer film that can form a resist pattern excellent in pattern collapse resistance in multilayer resist processes. These can be suitably used in pattern formation at a finer scale than 60 nm according to exposures by an ArF excimer laser beam, an ArF excimer laser beam in a liquid immersion exposure, an $F_2$ excimer laser beam, an EUV light, and the like, and a nanoimprint technology, and the like of multilayer resist processes.

What is claimed is:

1. A resist pattern-forming method comprising:
   (1) providing a resist underlayer film on a substrate using a composition for forming a resist underlayer film;
   (2) providing a resist film on the resist underlayer film using a photoresist composition;
   (3) exposing the resist film; and
   (4) developing the exposed resist film using a developer solution comprising no less than 80% by mass of an organic solvent,
   wherein the composition for forming a resist underlayer film comprises:
   a polysiloxane that comprises an acid anhydride group.

2. The resist pattern-forming method according to claim 1, wherein the composition for forming a resist underlayer film further comprises a nitrogen-containing compound.

3. A resist pattern-forming method comprising:
   (1) providing a resist underlayer film on a substrate using a composition for forming a resist underlayer film;
   (2) providing a resist film on the resist underlayer film using a photoresist composition;
   (3) exposing the resist film; and
   (4) developing the exposed resist film using a developer solution comprising no less than 80% by mass of an organic solvent,
   wherein the composition for forming a resist underlayer film comprises:
   a vinyl polymer that comprises a carboxyl group, an acid anhydride group or both thereof; and
   a polysiloxane.

4. The resist pattern-forming method according to claim 3, wherein the vinyl polymer further comprises a silicon-containing group.

5. The resist pattern-forming method according to claim 3, wherein the composition for forming a resist underlayer film further comprises a nitrogen-containing compound.

6. A resist pattern-forming method comprising:
   (1) providing a resist underlayer film on a substrate using a composition for forming a resist underlayer film;
   (2) providing a resist film on the resist underlayer film using a photoresist composition;
   (3) exposing the resist film; and
   (4) developing the exposed resist film using a developer solution comprising no less than 80% by mass of an organic solvent,
   wherein the composition for forming a resist underlayer film comprises:
   a vinyl polymer that comprises a group that can generate a carboxyl group by an action of an acid; and
   a polysiloxane.

7. The resist pattern-forming method according to claim 6, wherein the vinyl polymer further comprises a silicon-containing group.

8. The resist pattern-forming method according to claim 6, wherein the composition for forming a resist underlayer film further comprises a nitrogen-containing compound.

* * * * *